(12) United States Patent
Hakko et al.

(10) Patent No.: US 8,352,892 B2
(45) Date of Patent: Jan. 8, 2013

(54) METHOD, COMPUTER-READABLE STORAGE MEDIUM, AND APPARATUS FOR GENERATING A MASK DATA AND FABRICATING PROCESS

(75) Inventors: Manabu Hakko, Utsunomiya (JP); Miyoko Kawashima, Haga-gun (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/176,815

(22) Filed: Jul. 6, 2011

(65) Prior Publication Data

US 2012/0009509 A1 Jan. 12, 2012

(30) Foreign Application Priority Data

Jul. 8, 2010 (JP) .................................. 2010-156184

(51) Int. Cl.
*G06F 17/50* (2006.01)
(52) U.S. Cl. ................. 716/55; 716/50; 716/51; 716/52; 716/53; 716/54; 430/5; 430/30
(58) Field of Classification Search .............. 716/50–55; 430/5, 30
See application file for complete search history.

(56) References Cited

U.S. PATENT DOCUMENTS

| 7,480,891 B2 * | 1/2009 | Sezginer .......................... 716/50 |
| 7,877,723 B2 * | 1/2011 | Park ................................ 716/50 |

FOREIGN PATENT DOCUMENTS

| JP | 2004-221594 A | 8/2004 |
| JP | 2008-040470 A | 2/2008 |

* cited by examiner

*Primary Examiner* — Nghia Doan
(74) *Attorney, Agent, or Firm* — Rossi, Kimms & McDowell LLP

(57) ABSTRACT

The present invention provides a generation method that obtains a position at which an auxiliary pattern is to be placed and generates a mask pattern (its data), which achieves excellent imaging performance, even when a halftone mask is used as an original.

11 Claims, 13 Drawing Sheets

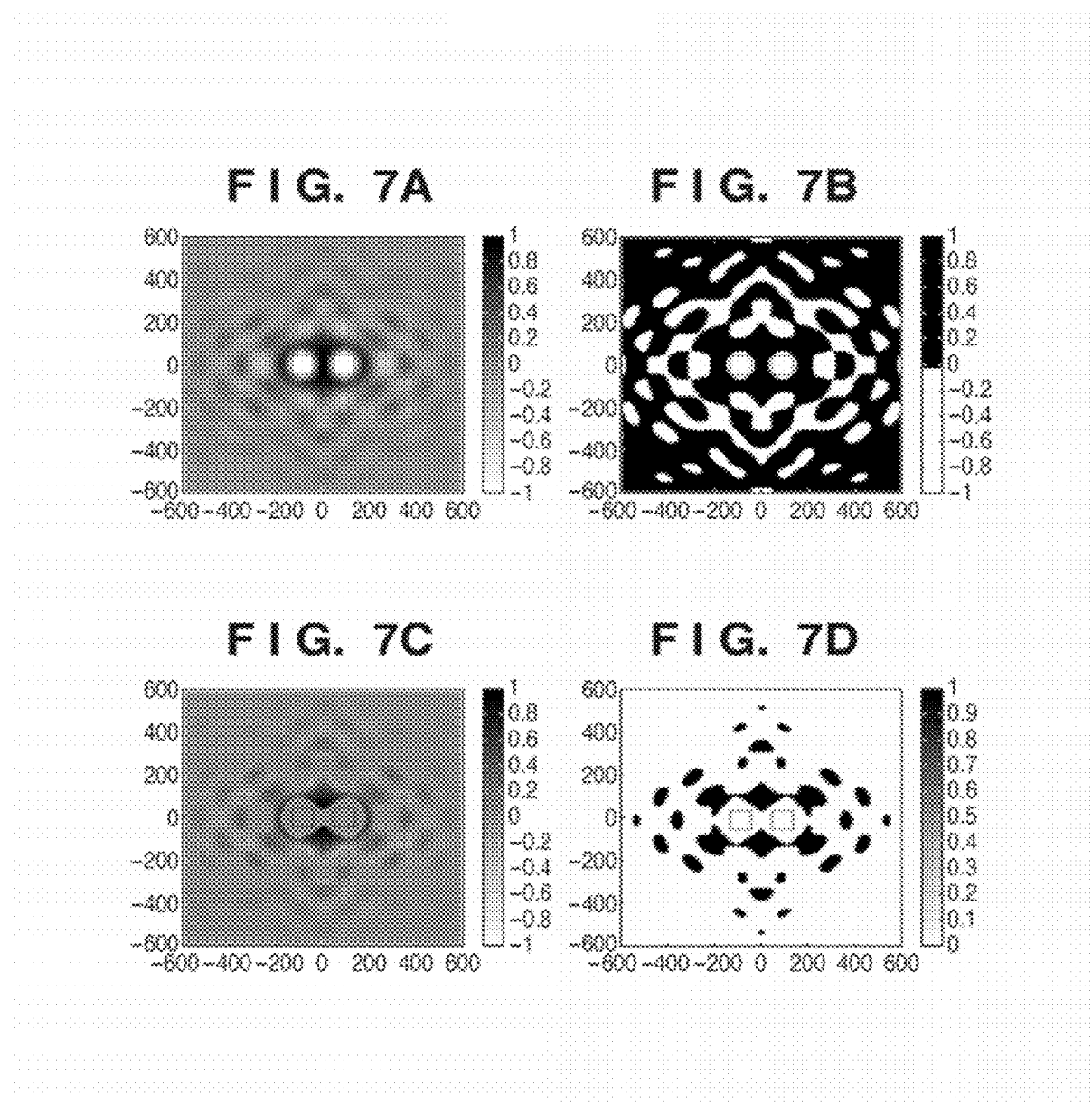

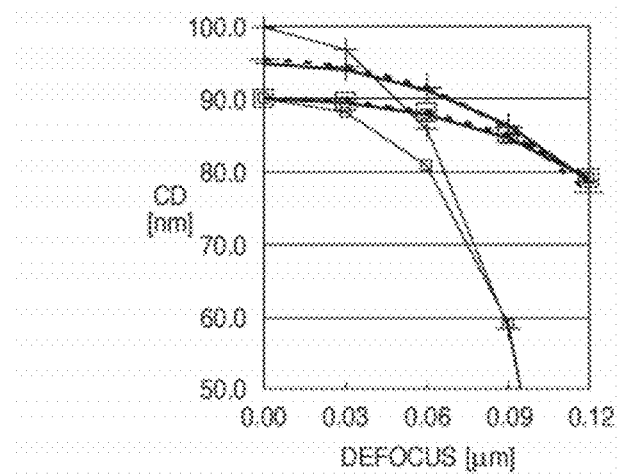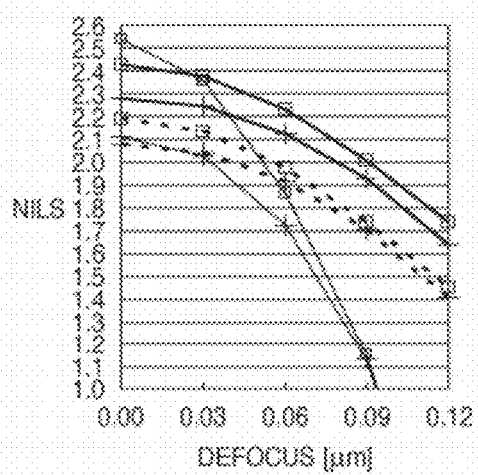

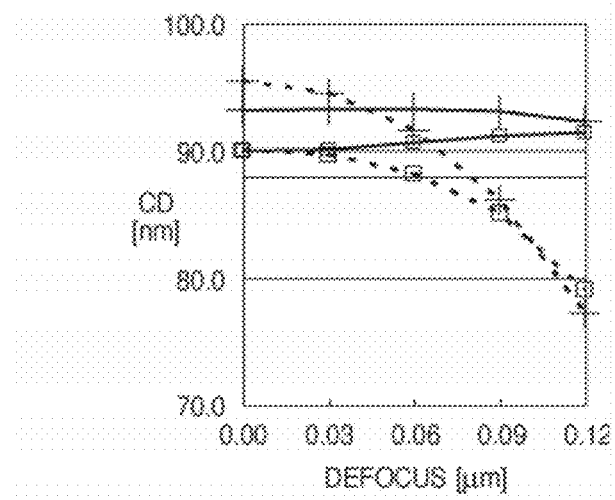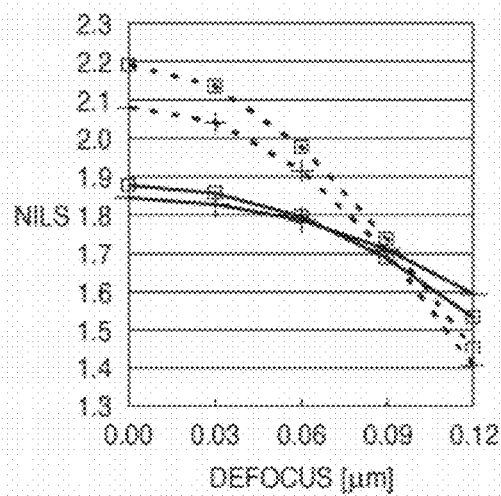
FIG. 12A
FIG. 12B

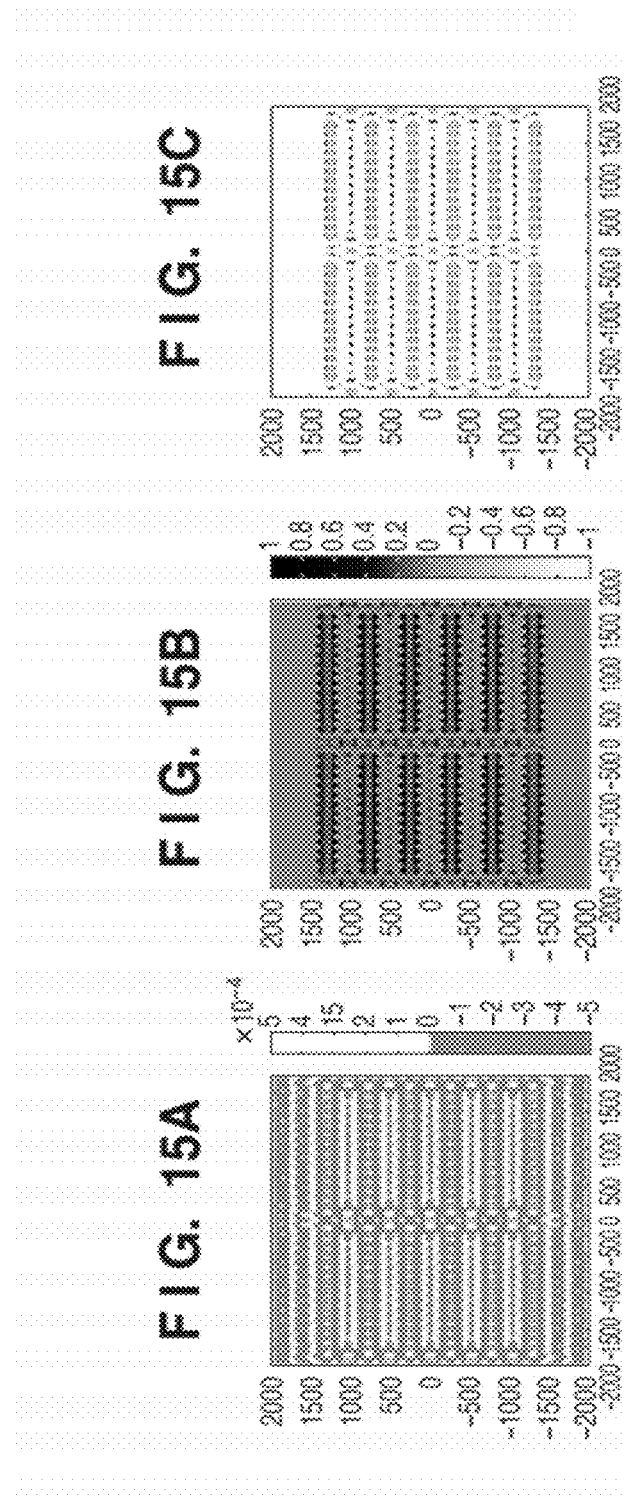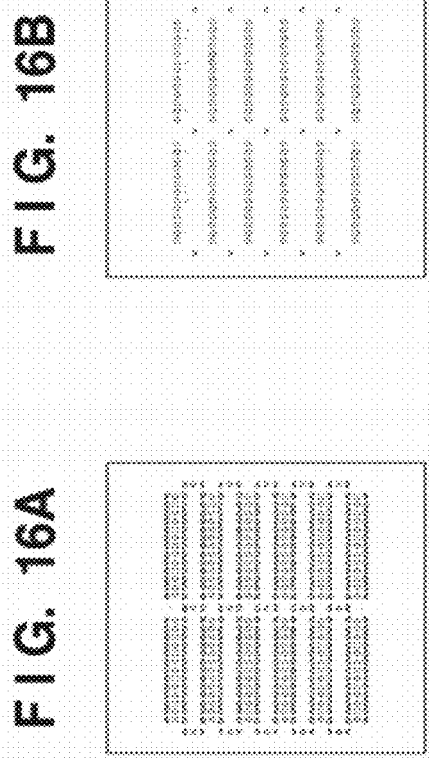

METHOD, COMPUTER-READABLE STORAGE MEDIUM, AND APPARATUS FOR GENERATING A MASK DATA AND FABRICATING PROCESS

BACKGROUND OF THE INVENTION

1. Field of the Invention

The present invention relates to a generation method, a creation method, an exposure method, a device fabrication method, a storage medium, and a generation apparatus.

2. Description of the Related Art

In the optical lithography technology, the pattern of an original (a mask or a reticle) used to form a pattern having a dimension less than a specific wavelength on a substrate such as a wafer does not always become similar to the pattern formed on the substrate, due to factors associated with correction of the optical proximity effect. Techniques of optimizing the pattern of an original have conventionally been proposed. Japanese Patent Laid-Open Nos. 2004-221594 and 2008-040470 propose techniques of determining an appropriate position for an auxiliary pattern (a pattern which itself is not resolved) in inserting the auxiliary pattern into a main pattern.

In the technique disclosed in Japanese Patent Laid-Open No. 2004-221594, a TCC (Transmission Cross Coefficient) must be calculated to calculate an interference map used to determine a position at which an auxiliary pattern is to be inserted. Hence, this technique requires an enormous amount of calculation and therefore requires a longer calculation time and a high-capacity computer memory.

The technique disclosed in Japanese Patent Laid-Open No. 2008-040470 can obtain a position at which an auxiliary pattern is to be inserted, with an amount of calculation which is smaller than that required in the technique disclosed in Japanese Patent Laid-Open No. 2004-221594. However, because there is little need to insert an auxiliary pattern in determining the pattern of a halftone mask serving as an original, Japanese Patent Laid-Open No. 2008-040470 discloses no embodiment in which a position at which an auxiliary pattern is to be inserted on the halftone mask is obtained. This is because a halftone mask is used to form a pattern having a large pitch more often than a binary mask, and the use of a halftone mask makes it possible to easily obtain a depth of focus larger than the use of a binary mask. Also, when an auxiliary pattern is inserted on a halftone mask using the same criterion as in a binary mask, the contrast may decrease.

Under such circumstances, a method of effectively increasing the depth of focus of a halftone mask with a smaller amount of calculation has not yet been proposed in the techniques of optimizing the pattern of an original. However, to keep pace with the growing demand for pattern miniaturization, a technique of forming a pattern having a smaller pitch using a halftone mask is in demand.

SUMMARY OF THE INVENTION

The present invention provides a technique advantageous to generate data of the pattern of a halftone mask serving as an original.

According to one aspect of the present invention, there is provided a generation method of using a computer to generate data of a pattern of an original used for an exposure apparatus including an illumination optical system which illuminates the original with light from a light source, and a projection optical system which projects the pattern of the original onto a substrate, the method including a first step of calculating a first approximate aerial image distribution represented by a complex number including a real part and an imaginary part as a distribution used to evaluate a light intensity distribution formed on an image plane of the projection optical system upon placing a pattern, which corresponds to a target pattern to be formed on the substrate, on an object plane of the projection optical system, a second step of calculating a second approximate aerial image represented by a complex number including a real part and an imaginary part as a distribution used to evaluate a light intensity distribution formed on a plane, which is defocused from the image plane of the projection optical system, upon placing the pattern corresponding to the target pattern on the object plane of the projection optical system, a third step of calculating a third approximate aerial image distribution by subtracting the first approximate aerial image distribution from the second approximate aerial image distribution, a fourth step of comparing a maximum value of an absolute value of a real part of the third approximate aerial image distribution and a maximum value of an absolute value of an imaginary part of the third approximate aerial image distribution to determine, of the real part and the imaginary part of the third approximate aerial image distribution, the one having a larger maximum value of the absolute value as a main part, and the other one as a non-main part, a fifth step of determining a temporary pattern obtained by placing a main pattern at a position on the object plane of the projection optical system corresponding to a position of the target pattern in the main part, and placing temporary auxiliary patterns having a transmittance and a phase equal to a transmittance and a phase of the main pattern at positions on the object plane of the projection optical system corresponding to positions in the main part, having a sign for an approximate aerial image value, which is identical to a sign for an approximate aerial image value at the position of the target pattern in one of the first approximate aerial image distribution and the second approximate aerial image distribution, and a sixth step of determining, as an actual auxiliary pattern, a temporary auxiliary pattern, which is placed at a position on the object plane of the projection optical system corresponding to a position having an absolute value less than a threshold for an approximate aerial image at the position of the target pattern in the non-main part, among the temporary auxiliary patterns, setting at least one of the transmittance and the phase of a temporary auxiliary pattern, which is placed at a position on the object plane of the projection optical system corresponding to a position having an absolute value of not less than the threshold for the approximate aerial image at the position of the target pattern in the non-main part, among the temporary auxiliary patterns, to be different from the transmittance and the phase of the main pattern to determine the temporary auxiliary pattern as an actual auxiliary pattern, and generating data of a pattern including the actual auxiliary patterns and the main pattern as the data of the pattern of the original.

Further features of the present invention will become apparent from the following description of exemplary embodiments with reference to the attached drawings.

BRIEF DESCRIPTION OF THE DRAWINGS

FIGS. 7A to 7D are views for explaining mask data generation in the first embodiment.

FIGS. 10A and 10B are graphs for explaining mask data generation in the first embodiment.

FIGS. 12A and 12B are graphs for explaining mask data generation in the first embodiment.

FIGS. 15A to 15C are views for explaining mask data generation in the second embodiment.

FIGS. 16A and 16B are views for explaining mask data generation in the second embodiment.

DESCRIPTION OF THE EMBODIMENTS

Figure 1:
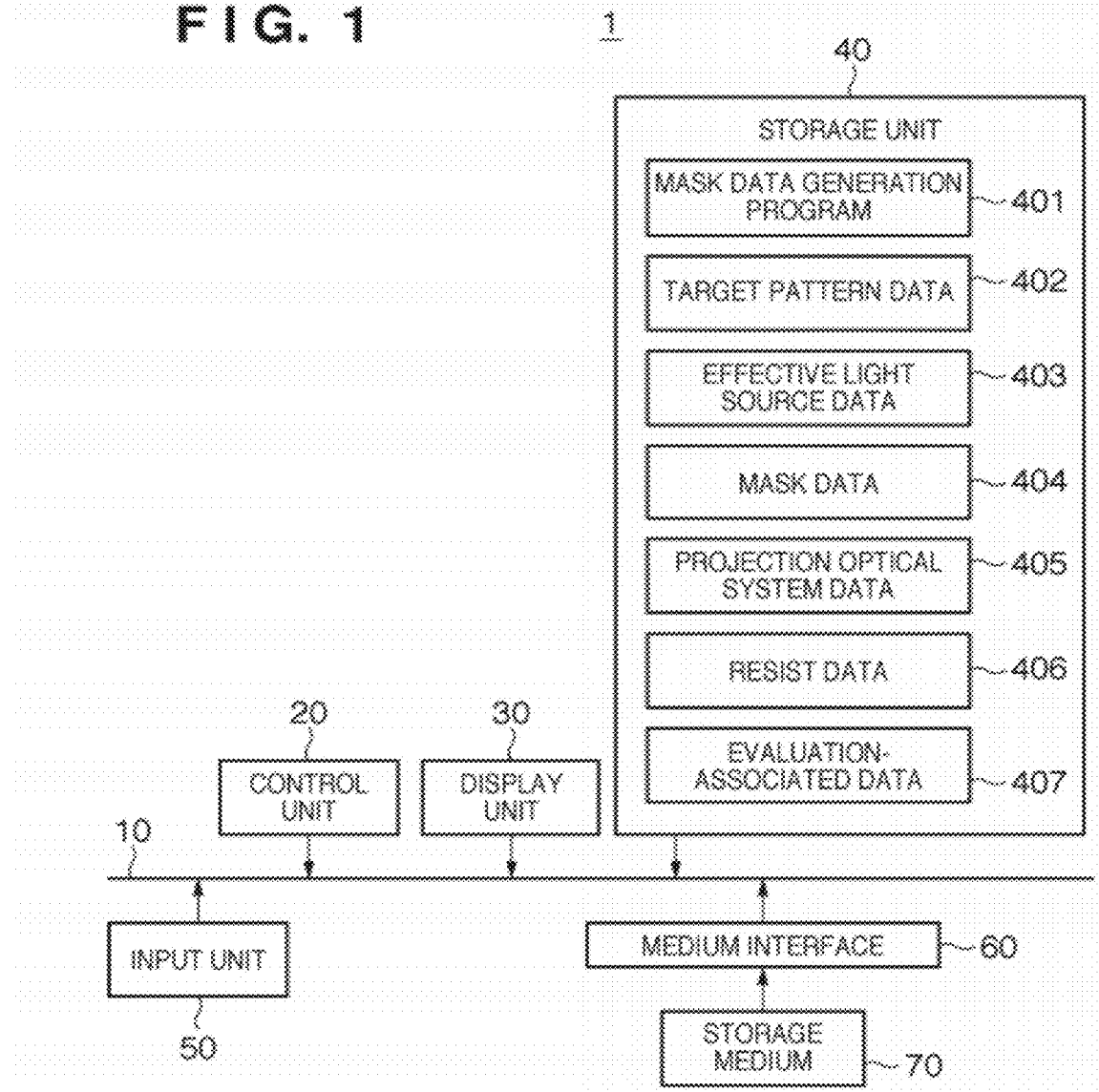
FIG. 1 is a schematic block diagram showing the configuration of an information processing apparatus which executes a mask data generation method according to an aspect of the present invention.

Preferred embodiments of the present invention will be described below with reference to the accompanying drawings. Note that the same reference numerals denote the same members throughout the drawings, and a repetitive description thereof will not be given.

The present invention is applicable to generation of data of the pattern of an original used in micromechanics and in fabricating various devices such as a semiconductor chip such as an IC or an LSI, a display device such as a liquid crystal panel, a detection device such as a magnetic head, and an image sensing element such as a CCD. The micromechanics means herein a technique of creating a micron-scale machinery system with sophisticated functions by applying a semiconductor integrated circuit fabrication technique to microstructure fabrication, or the machinery system itself. The present invention is suitable for determining the pattern (its data) of an original used for, for example, an immersion exposure apparatus which forms a latent image on a resist (photosensitive agent), coated on a substrate, via a projection optical system and a liquid while the space between the projection optical system and the substrate is filled with the liquid. Note that the latent image means the pattern formed on the resist.

A halftone mask will be taken as an example of an original in this embodiment. However, the present invention is not limited to a halftone mask, and is also applicable to a binary mask. Note that the halftone mask means a mask which is formed from a semitranslucent member in a portion corresponding to the light-shielding portion of a binary mask and is 180° out of phase with its aperture (transparent) portion.

Also, the present invention is not limited to a so-called dark-field transmissive mask (or a dark-field reflective mask) which forms a pattern in a portion having a light intensity equal to or higher than a predetermined value, and is also applicable to a so-called clear-field transmissive mask (or a clear-field reflective mask) which forms a pattern in a portion having a light intensity equal to or lower than a predetermined value.

In this embodiment, a latent image pattern to be formed on a substrate (a resist coated on it) will be referred to as a target pattern. Also, a pattern provided on a mask to form a target pattern will be referred to as a mask pattern. The mask pattern includes, for example, a main pattern having a shape similar to that of the target pattern, and auxiliary patterns (also called assist patterns or dummy patterns) inserted into the main pattern. The pattern is not resolved at a position on the image plane corresponding to that of the auxiliary pattern placed on the object plane (that is, the auxiliary pattern is not resolved). On the other hand, the pattern is resolved at a position on the image plane corresponding to that of the main pattern placed on the object plane (that is, the main pattern is resolved). Note that an information processing apparatus (computer) generates data of the mask pattern. The main pattern may have a shape which is not similar to that of the target pattern. For example, the main pattern may have a shape generated by OPC (Optical Proximity Correction).

FIG. 1 is a schematic block diagram showing the configuration of an information processing apparatus 1 which executes a generation method according to an aspect of the present invention. The generation method executed by the information processing apparatus 1 generates data of the pattern (mask pattern) of a mask used for an exposure apparatus including an illumination optical system which illuminates a mask with light from a light source, and a projection optical system which projects the pattern of the mask onto a substrate.

The information processing apparatus 1 includes a bus line 10, control unit 20, display unit 30, storage unit 40, input unit 50, and medium interface 60, as shown in FIG. 1. Note that the bus line 10 connects the control unit 20, display unit 30, storage unit 40, input unit 50, and medium interface 60 to each other.

The control unit 20 uses, for example, a CPU, a GPU, a DSP, or a microcomputer, and includes, for example, a cache memory for temporary storage. The control unit 20 starts up and executes a mask data generation program 401 stored in the storage unit 40, based on a startup command for the mask data generation program 401, which is input by the user via the input unit 50. The control unit 20 executes an arithmetic operation associated with mask data generation, using the data stored in the storage unit 40.

The display unit 30 uses, for example, a display device such as a CRT display or a liquid crystal display. The display unit 30 displays, for example, information (for example, effective light source data 403 or mask data 404) associated with execution of the mask data generation program 401.

The storage unit 40 uses, for example, a semiconductor memory or a hard disk. The storage unit 40 stores the mask data generation program 401 provided by a storage medium 70 connected to the medium interface 60. The storage unit 40 also stores target pattern data 402, effective light source data 403, mask data 404, projection optical system data 405, resist data 406, and evaluation-associated data 407.

The mask data generation program 401 is a program which generates the mask data 404 that is data of the mask pattern. Note that the pattern is formed from closed figures, and a set of them constitutes the pattern of the entire mask.

The target pattern data 402 is data of a layout pattern (that is, a target pattern to be formed on the substrate) obtained by layout design of, for example, an integrated circuit.

The effective light source data 403 is data associated with polarization and a light intensity distribution formed on the pupil plane of the projection optical system when no mask is placed on the object plane of the projection optical system (effective light source). The effective light source data 403 also includes wavelength data associated with the wavelength of exposure light.

The mask data 404 is data indicating a final mask pattern generated by executing the mask data generation program 401. The mask data 404 is data including a main pattern having a shape similar to that of a target pattern to be formed on the substrate, and auxiliary patterns. However, the mask data 404 may include only a main pattern and include no auxiliary patterns.

The projection optical system data 405 is data associated with the projection optical system, and includes, for example, information associated with the image-side numerical aperture (NA) of the projection optical system and that associated with the aberration of the projection optical system. If the projection optical system has birefringence, a phase shift occurs depending on the characteristics associated with the birefringence, and this phase shift can be interpreted as one type of aberration.

The resist data 406 is information associated with a resist coated on the substrate.

The evaluation-associated data 407 includes, for example, data indicating whether to adjust the main pattern, and data indicating the types of imaging performance (for example, the hole diameter (CD) and the NILS) used to evaluate the image characteristics of the mask pattern.

The input unit 50 includes, for example, a keyboard and mouse. The user can input, for example, various types of data associated with execution of the mask data generation program 401 via the input unit 50.

The medium interface 60 includes, for example, a CD-ROM drive, DVD-ROM drive, and a USB interface, and can be connected to the storage medium 70. Note that the storage medium 70 includes, for example, a CD-ROM, DVD-ROM, and USB memory, and provides the mask data generation program 401 and other programs to be executed by the information processing apparatus 1.

Figure 2:
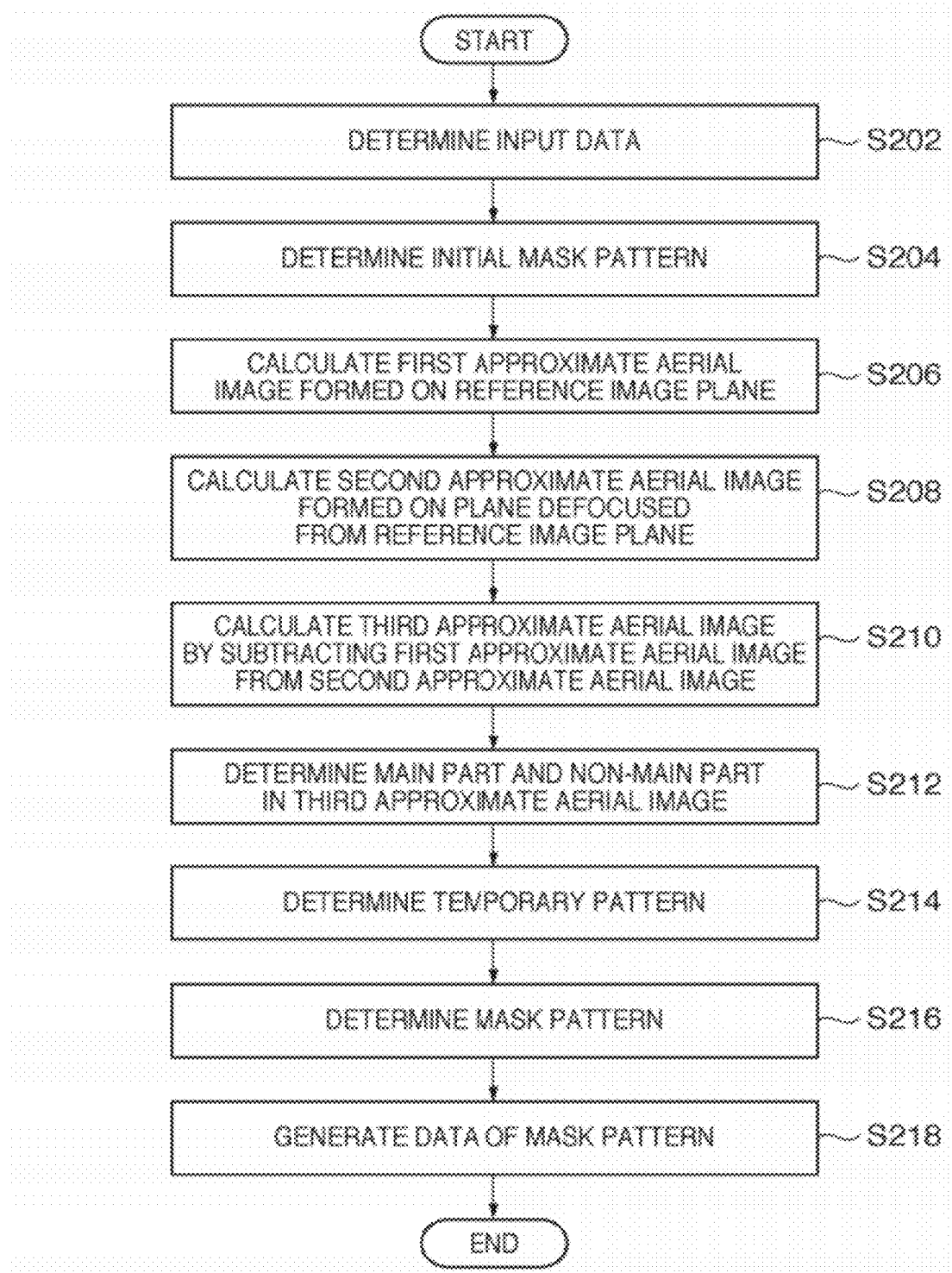
FIG. 2 is a flowchart for explaining the mask data generation method according to the aspect of the present invention.

A process in which the information processing apparatus 1 (control unit 20) executes the mask data generation program 401 to generate mask data 404 will be described below with reference to FIG. 2.

In step S202, input data which is necessary to execute the mask data generation program 401 and includes, for example, the target pattern data 402, effective light source data 403, projection optical system data 405, resist data 406, and evaluation-associated data 407 is determined in accordance with the input by the user.

In step S204, an initial mask pattern is determined based on the input data determined in step S202. A pattern corresponding to the target pattern, for example, is determined as an initial mask pattern. However, a pattern deformed by performing OPC (Optical Proximity Correction) for a pattern corresponding to the target pattern may be determined as an initial mask pattern.

In steps S206 and S208, two types of approximate aerial images which are formed on the image plane of the projection optical system and are used to calculate distributions used to evaluate the characteristics of latent images are calculated based on the input data and initial mask pattern which are determined in steps S202 and S204, respectively. More specifically, in step S206, a first approximate aerial image (first approximate aerial image distribution) formed on a reference image plane for the projection optical system upon placing the initial mask pattern (that is, the pattern corresponding to the target pattern) on the object plane of the projection optical system is calculated. Also, in step S208, a second approximate aerial image (second approximate aerial image distribution) formed on a plane, which is defocused from the reference image plane for the projection optical system, upon placing the initial mask pattern on the object plane of the projection optical system is calculated. Note that an approximate aerial image can be calculated using, for example, the technique disclosed in Japanese Patent Laid-Open No. 2008-040470, and is represented by a complex number including a real part and an imaginary part in this embodiment. Also, instead of calculating an exact aerial image, an approximate aerial image is calculated because the time taken to calculate an approximate aerial image is overwhelmingly shorter than that taken to calculate an exact aerial image, thus making it possible to obtain data of the mask pattern within a short period of time.

In step S210, a third approximate aerial image (third approximate aerial image distribution) is calculated by subtracting the first approximate aerial image calculated in step S206 from the second approximate aerial image calculated in step S208. In this manner, the third approximate aerial image is described by (Second Approximate Aerial Image)−(First Approximate Image), and is generally represented by a complex number including a real part and an imaginary part.

In step S212, a main part and a non-main part in the third approximate aerial image are determined. More specifically, first, the maximum value of the absolute value of the real part and that of the imaginary part in the third approximate image are compared. Then, of the real part and the imaginary part of the third approximate aerial image, the one having a larger maximum value of the absolute value (for example, the real part) is determined as a main part, and the other one (for example, the imaginary part) as a non-main part. In this embodiment, in a step to be described later, a position at which an auxiliary pattern is to be placed (inserted) is determined upon separately using the main part and the non-main part of the third approximate aerial image. Note that the second-order derivative of the third approximate aerial image with respect to the position may be obtained to calculate a second-order derivative map in step S212, and a position at which an auxiliary pattern is to be placed may be determined based on the second-order derivative map in a step to be described later. The contrast improves by obtaining the second-order derivative of the third approximate aerial image with respect to the position, and this facilitates determination of a position at which an auxiliary pattern is to be placed.

In the prior arts, a mask pattern is determined based on an approximate aerial image at a single focus position (for example, a best focus image plane or a defocus image plane). More specifically, a main pattern is placed at a position on the object plane corresponding to that of the target pattern. Then, an auxiliary pattern is placed at a position on the object plane corresponding to that having the same sign for the approximate aerial image value as that at the position of the target pattern in an approximate aerial image at one specific image plane position to determine a mask pattern. However, in case of a halftone mask, no position having the same sign for the approximate aerial image value as that at the position of the target pattern often appears at all in an approximate aerial image at a single focus position, thus making it impossible to obtain a position at which an auxiliary pattern is to be placed.

In contrast, in this embodiment, a position at which an auxiliary pattern is to be placed is determined from the difference between two approximate aerial images corresponding to two focus positions, that is, the third approximate aerial image. The third approximate aerial image is generally represented by a complex number including a real part and an imaginary part, as described above. Hence, in this embodiment, one of the real part and the imaginary part of the third approximate aerial image is determined as a main part and the other one as a non-main part, and a mask pattern is determined upon separately using the main part and the non-main part, as will be described later. Thus, even if no position having the same sign for the approximate aerial image value as that at the position of the target position appears at all in the first or second approximate aerial image, a position having the same sign for the approximate aerial image value as that at the position of the target pattern can be specified in the third approximate aerial image. Therefore, in this embodiment, a position at which an auxiliary pattern is to be placed can be obtained even in case of a halftone mask.

In step S214, a temporary pattern for a mask is determined (that is, a mask pattern is temporarily determined) based on the third approximate aerial image (its main part). In this case, a main pattern is placed at a position on the object plane corresponding to that of the target pattern in the main part. Then, temporary auxiliary patterns are placed at positions on the object plane corresponding to those in the main part, having the same sign for the approximate aerial image value as that at the position of the target pattern in the first approximate aerial image distribution or the second approximate aerial image distribution, to determine a temporary pattern for a mask. Note that the temporary auxiliary pattern has the same transmittance as the main pattern.

In step S216, a mask pattern is determined from the temporary pattern for a mask determined in step S214, based on the third approximate aerial image (its non-main part). In this case, among the temporary auxiliary patterns in the temporary pattern for a mask, a temporary auxiliary pattern placed at a position on the object plane corresponding to that having a sign for the approximate aerial image value, which is different from that at the position of the target pattern in the non-main part, and an absolute value equal to or larger than a threshold, is adjusted and determined as an actual auxiliary pattern. Also, a non-adjusted temporary auxiliary pattern becomes an actual auxiliary pattern. Note that adjustment of a temporary auxiliary pattern includes, for example, setting the transmittance of the temporary auxiliary pattern lower than that of the main pattern, and setting the transmittance of the temporary auxiliary pattern to zero (that is, removal of the temporary auxiliary pattern). Then, a pattern including the main pattern and actual auxiliary patterns is determined as a mask pattern. At this time, the main pattern may be deformed so that the difference between the target pattern and the image calculated from the mask pattern falls within a tolerance. Also, the size of the actual auxiliary pattern may be changed so that the pattern is not resolved.

In step S218, data (that is, mask data 404) of the mask pattern determined in step S216 is generated.

Mask data (mask pattern) generated by executing a mask data generation program will be described in detail below in the first and second embodiments.

First Embodiment

In the first embodiment, a positive resist is assumed as a resist coated on a substrate, and a pattern is assumed to be formed in a portion having a light intensity equal to or higher than a predetermined value. An immersion exposure apparatus which uses a projection optical system having an NA of 1.20, exposure light having a wavelength λ of 193 nm, and water having a refractive index of 1.44 as an immersion liquid is assumed as an exposure apparatus used. The projection optical system is assumed to have no aberration. Also, a halftone mask (halftone phase shift mask) is assumed as a mask used, the pattern and the background are assumed to be π (180°) out of phase with each other, the pattern is assumed to have a transmittance of 100%, and the background is assumed to have a transmittance of 6%.

Figures 3B, 3C:
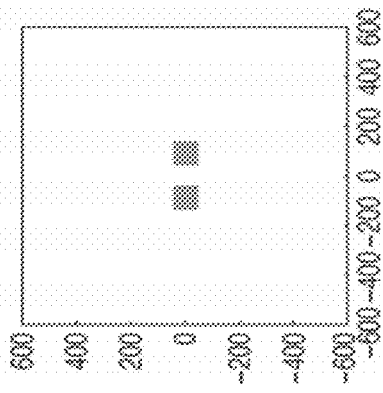
FIGS. 3A to 3C are views for explaining mask data generation in the first embodiment.
Figure 3A:
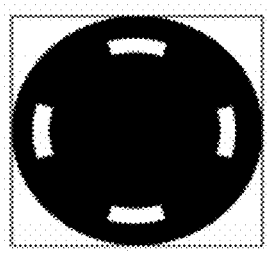

A pattern in which two 90-nm diameter holes are arranged, as shown in FIG. 3B, is assumed as a target pattern. The center positions (x, y) of the two holes are (−90, 0), and (90, 0), respectively. The half pitch of the target pattern shown in FIG. 3B is 90 nm, that is, 0.56λ/NA, which is very small for the halftone mask. Also, circularly polarized quadrupole illumination (white portions transmit light), as shown in FIG. 3A, is assumed to be used for an effective light source.

The amount of defocus of a reference image plane in calculating a first approximate aerial image is assumed to be zero, and that of a plane defocused from the reference image plane in calculating a second approximate aerial image is assumed to be 75 nm. The amount of defocus is set such that the sign of the approximate aerial image value at the position of the target pattern (an image of the main pattern) in the second approximate aerial image is the same as that of the approximate aerial image value at the position of the target pattern (an image of the main pattern) in the first approximate aerial image.

In the first embodiment, a pattern including two holes (main pattern) having a shape similar to that of the target pattern shown in FIG. 3B is determined as an initial mask pattern, as shown in FIG. 3C. FIG. 3C shows an initial mask pattern using the dimensional scale on the image plane in consideration of the magnification of the projection optical system. In the following description, the dimension of a mask pattern is given using the dimensional scale on the image plane. The transmittance of the pattern formed from two holes (rectangular gray portions) is 100%, the transmittance of the background (white portion) is 6%, and the pattern and the background are π out of phase with each other, as described above.

Figure 4A:
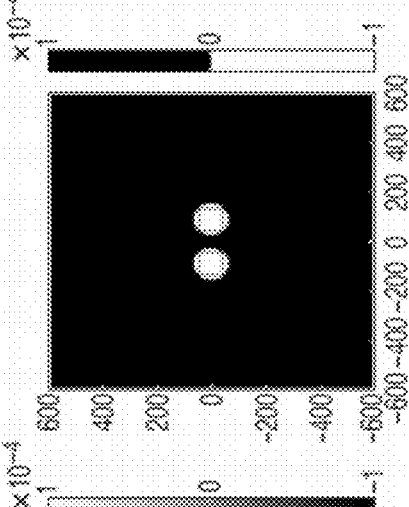
FIGS. 4A and 4B are views for explaining mask data generation in the first embodiment.
Figure 4B:
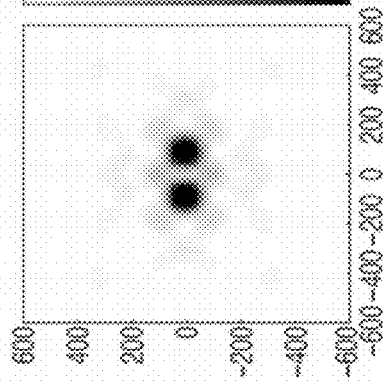

When a first approximate aerial image distribution formed on the reference image plane upon placing the initial mask pattern shown in FIG. 3C on the object plane is calculated, a distribution as shown in FIG. 4A is obtained. FIG. 4A is a view showing the real part of the first approximate aerial image, and shows by superposition the initial mask pattern shown in FIG. 3C for the sake of clearly representing the relative positional relationship with the initial mask pattern shown in FIG. 3C. The imaginary part of the first approximate aerial image is zero. FIG. 4B shows the result of identifying by color coding the approximate aerial image value in the real part of the first approximate aerial image distribution shown in FIG. 4A, in accordance with whether its sign is positive or negative. As can be seen from FIG. 4B, the approximate aerial image value at the position of the target pattern (corresponding to an image of the initial mask pattern shown in FIG. 3C) has a negative sign. In the prior arts, an auxiliary pattern is placed at a position having the same sign for the approximate aerial image value as that at the position of the target pattern, that is, a negative sign in the first approximate aerial image distribution shown in FIG. 4A. However, no position having a negative sign for the approximate aerial image value is present in a region distant from the position of the target pattern in the first approximate aerial image shown in FIG. 4A, so a position at which an auxiliary pattern is to be placed cannot be obtained.

Figure 5A:
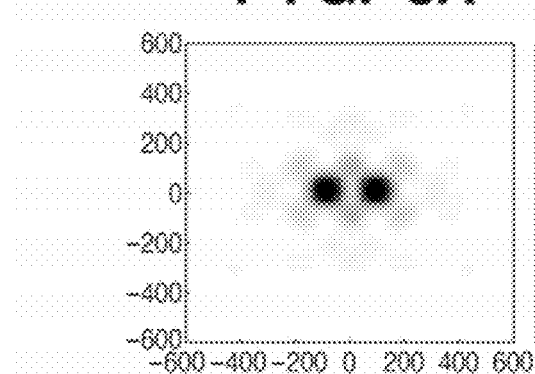
FIGS. 5A to 5D are views for explaining mask data generation in the first embodiment.
Figure 5B:
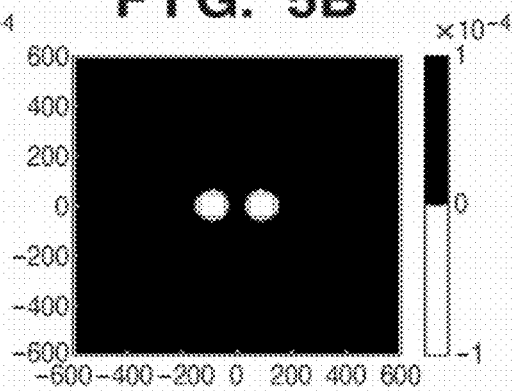
Figure 5C:
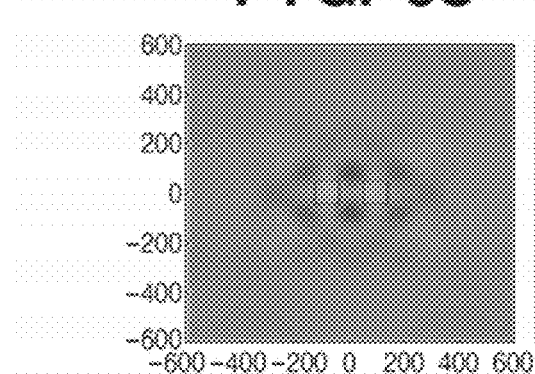
Figure 5D:
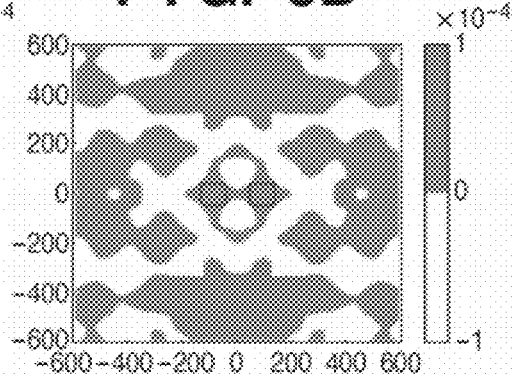

When a second approximate aerial image distribution formed on the plane, which is defocused from the reference image plane, upon placing the initial mask pattern shown in FIG. 3C on the object plane is calculated, distributions as shown in FIGS. 5A and 5C are obtained. FIG. 5A is a view showing the real part of the second approximate aerial image, and FIG. 5C is a view showing the imaginary part of the second approximate aerial image. FIGS. 5A and 5C show by superposition the initial mask pattern shown in FIG. 3C. FIG. 5B shows the result of identifying by color coding the approximate aerial image value in the real part of the second approximate aerial image distribution shown in FIG. 5A, in accordance with whether its sign is positive or negative. FIG. 5D shows the result of identifying by color coding the approximate aerial image value in the imaginary part of the second approximate aerial image distribution shown in FIG. 5C, in accordance with whether its sign is positive or negative. As can be seen from FIG. 5B, no position having the same sign for the approximate aerial image value as that at the position of the target pattern is present in a region distant from the position of the target pattern in the real part of the second approximate aerial image, so a position at which an auxiliary pattern is to be placed cannot be obtained. It is possible to place an auxiliary pattern at a position having a sign for the approximate aerial image value, which is different from that at the position of the target pattern, and a small absolute value. In this case, the imaging performance can be improved, but nonetheless only a small effect of increasing the depth of focus can be obtained. The same holds true for the first approximate image. Therefore, it is impossible to obtain a great effect even when a position at which an auxiliary pattern is to be placed is obtained from an approximate aerial image produced by adding the first approximate aerial image and second approximate aerial image.

Figure 6A:
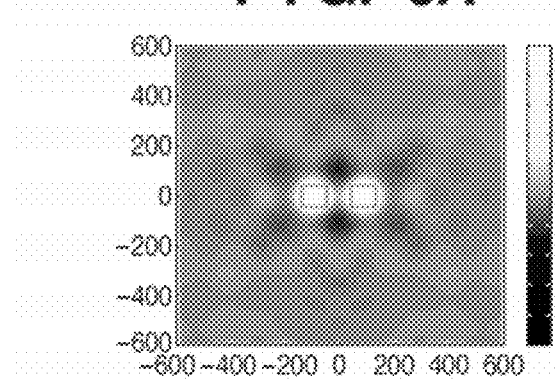
FIGS. 6A and 6B are views for explaining mask data generation in the first embodiment.
Figure 6B:
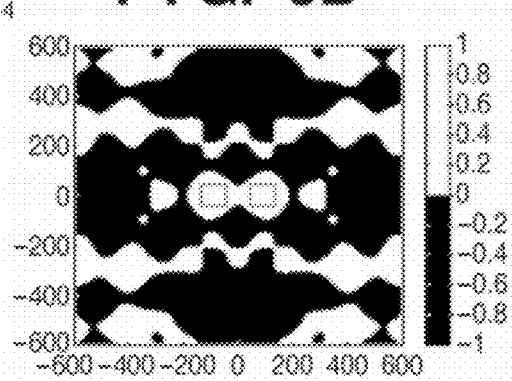

When a third approximate aerial image is calculated by subtracting the first approximate aerial image from the second approximate aerial image, a third approximate aerial image as shown in FIG. 6A is obtained. FIG. 6A is a view showing the real part of the third approximate aerial image, and shows by superposition the initial mask pattern shown in FIG. 3C. The imaginary part of the third approximate aerial image is equal to that of the second approximate aerial image shown in FIG. 5C because the imaginary part of the first approximate aerial image is zero. FIG. 6B shows the result of identifying by color coding the approximate aerial image value in the real part of the third approximate aerial image distribution shown in FIG. 6A, in accordance with whether its sign is positive or negative. As can be seen from FIG. 6B, a position having the same sign for the approximate aerial image value as that at the position of the target pattern, that is, a negative sign is present in a region distant from the position of the target pattern, so the position at which an auxiliary pattern is to be placed has a candidate. As can be seen from FIG. 6B as well, a portion adjacent to the position of the target pattern has a positive sign for the approximate aerial image value and is therefore ruled out as a candidate for the position at which an auxiliary pattern is to be placed.

As can be seen from a comparison between FIGS. 6A and 5C, the maximum value of the absolute value is larger in the real part than in the imaginary part in the third approximate aerial image distribution, so the real part of the third approximate aerial image distribution is determined as a main part and its imaginary part as a non-main part.

When the second-order derivative of the real part of the third approximate aerial image shown in FIG. 6A with respect to the position is obtained to calculate a second-order derivative map, a map shown in FIG. 7A is obtained. Because the contrast is higher in the second-order derivative map shown in FIG. 7A than in the third approximate aerial image shown in FIG. 6A, a position at which an auxiliary pattern is to be placed can easily be obtained using the second-order derivative map shown in FIG. 7A. The main part and the non-main part of the approximate aerial image obtained after second-order differentiation are identical to those of the approximate aerial image before second-order differentiation, so the real part becomes a main part and the imaginary part becomes a non-main part. A main part and a non-main part may be newly determined for the approximate aerial image obtained after second-order differentiation. The second-order derivative map shown in FIG. 7A has the real part as a main part and the imaginary part as a non-main part. FIG. 7B shows the result of identifying by color coding the second-order derivative value in the second-order derivative map shown in FIG. 7A, in accordance with whether its sign is positive or negative. Referring to FIG. 7B, a position having a positive sign indicates a valley position, and a position having a negative sign indicates a peak position.

An auxiliary pattern having the same transmittance and phase as the main pattern is placed at a position on the object plane of the projection optical system, which satisfies all of:

Condition (1)

in which the value of the main part of the third approximate aerial image has the same sign for the approximate aerial image value as that at the position of the target pattern (main pattern) in the main part of the first approximate aerial image (or the second approximate aerial image);

Condition (2)

in which the approximate aerial image value at the position of the target pattern in the main part of the first approximate aerial image (or the second approximate aerial image) has a positive sign, and the second-order derivative value in the main part of the second-order derivative map has a negative sign (peak), or the approximate aerial image value at the position of the target pattern in the main part of the first approximate aerial image (or the second approximate aerial image) has a negative sign, and the second-order derivative value in the main part of the second-order derivative map has a positive sign (valley); and Condition (3)

in which the second-order derivative value in the main part of the second-order derivative map has an absolute value equal to or larger than a threshold.

If, for example, the approximate aerial image value at the position of the target pattern in the first approximate aerial image is positive, a position having a negative sign (peak) for the second-order derivative value in the second-order derivative map and an absolute value equal to or larger than the threshold is determined as that at which an auxiliary pattern (temporary auxiliary pattern) is to be placed. In the first embodiment, the approximate aerial image value at the position of the target pattern in the first approximate aerial image is negative, so a position having a positive sign (valley) for the second-order derivative value in the second-order derivative map shown in FIG. 7A and an absolute value equal to or smaller than the threshold is determined as that at which an auxiliary pattern is to be placed. Note that the auxiliary pattern has the same transmittance and phase as the main pattern. FIG. 7C is a view showing the result of extracting positions in the second-order derivative map shown in FIG. 7A corresponding to those having a negative sign for the approximate aerial image value in the third approximate aerial image. As an extraction method, a method of replacing with zero a position in the second-order derivative map corresponding to that having a positive sign for the approximate aerial image value in the third approximate aerial image is employed.

Therefore, referring to FIG. 7C, a position having a positive sign (valley) for the second-order derivative value corresponds to that having a negative local minimum value (valley) as the approximate aerial image value in the main part (real part) of the third approximate aerial image. In the first embodiment, as shown in FIG. 7D, a position on the object plane corresponding to that having a negative approximate aerial image value of C0 or less in the real part of the third approximate aerial image and a positive second-order derivative value (valley) of C1 or less in FIG. 7C is determined as that at which an auxiliary pattern is to be placed, as shown in FIG. 7D.

Figure 8A:
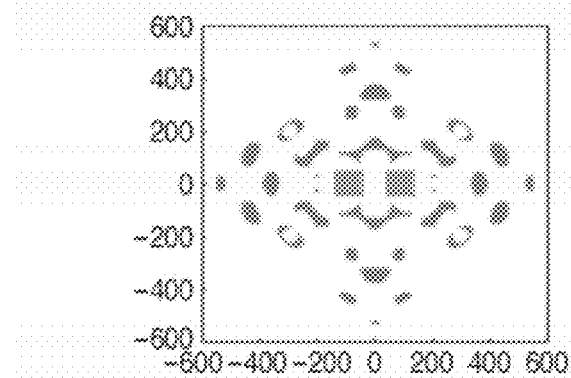
FIGS. 8A to 8D are views for explaining mask data generation in the first embodiment.

Although mask data may be generated based on the position at which an auxiliary pattern is to be placed, shown in FIG. 7D, the auxiliary pattern is adjusted using the imaginary part that is the non-main part of the third approximate aerial image in the first embodiment. An auxiliary pattern placed at a position on the object plane corresponding to that having a sign for the approximate aerial image value, which is different from that at the position of the target pattern in the non-main part of the third approximate aerial image (or the second-order derivative map obtained after second-order differentiation), and an absolute value equal to or larger than the threshold, is removed among the auxiliary patterns. In other words, at least one of the transmittance and phase of the auxiliary pattern placed at that position is set different from that of the main pattern. Removal of an auxiliary pattern means herein setting the transmittance and phase of the auxiliary pattern equal to those of the background. FIG. 8A shows the result of removing auxiliary patterns, which are placed at positions having an absolute value of C2 or more for the approximate aerial image in the imaginary part (see FIG. 5C) of the third approximate aerial image, among the auxiliary patterns shown in FIG. 7B. Note that an auxiliary pattern placed at a position having a sign for the approximate aerial image value, which is different from that at the position of the target pattern in the imaginary part (see FIG. 5C) of the third approximate aerial image, and an absolute value equal to or larger than the threshold, may be removed among the auxiliary patterns shown in FIG. 7B.

Figure 8B:
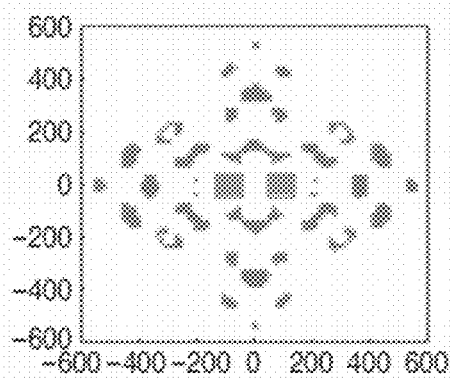
Figure 8C:
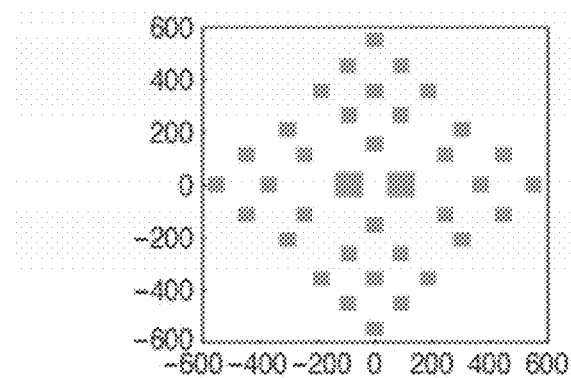

A position at which an auxiliary pattern is to be placed may be indicated by lowering the resolution of the distribution of the position at which an auxiliary pattern is to be placed to a predetermined resolution, and increasing the size of grids representing this distribution to define a set of rectangular grids having a length equal to or larger than a predetermined value. FIG. 8B shows the result of representing an auxiliary pattern (a position at which it is to be placed) using a set of rectangular grids having a length equal to or larger than a predetermined value by lowering the resolution of the distribution shown in FIG. 8A and increasing the size of grids. FIG. 8C shows the result of representing an auxiliary pattern using a single rectangle by further lowering the resolution of the distribution shown in FIG. 8A.

Figure 8D:
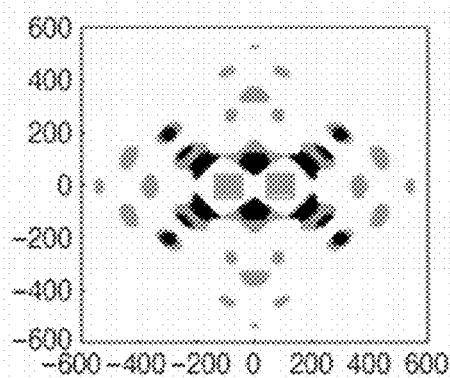

The transmittance of an auxiliary pattern placed at a position having a large absolute value for the approximate aerial image value in the imaginary part of the third approximate aerial image may be set to zero, instead of removing this auxiliary pattern. FIG. 8D shows the result of setting the transmittances of auxiliary patterns, which are placed at positions having an absolute value of C2 or more for the approximate aerial image value in the imaginary part of the third approximate aerial image, to zero (that is, the result of using light-shielding patterns for these auxiliary patterns). Referring to FIG. 8D, the position of a light-shielding pattern is indicated by black, and that of an auxiliary pattern is indicated by gray. A position at which a light-shielding pattern is to be placed may be that which satisfies:

Condition (A)

in which this position has an absolute value of C2 or more for the approximate aerial image value in the non-main part (imaginary part) of the third approximate aerial image, and a sign for the approximate aerial image value, which is different from or the same as that at the position of the target pattern (main pattern) in the first approximate aerial image (or the second approximate aerial image).

The initial mask pattern shown in FIG. 3C is used as a main pattern, and a first mask pattern and second mask pattern for which different auxiliary patterns are placed are determined. The first mask pattern is obtained when auxiliary patterns, which are placed at positions having an absolute value of C2 or more for the approximate aerial image in the imaginary part (see FIG. 5C) of the third approximate aerial image, are removed among the auxiliary patterns shown in FIG. 7B. In other words, the first mask pattern is a mask pattern having the initial mask pattern shown in FIG. 3C as a main pattern, and the auxiliary patterns shown in FIG. 8B. The second mask pattern is obtained when light-shielding patterns are used for auxiliary patterns, which are placed at positions having an absolute value of C2 or more for the approximate aerial image value in the imaginary part (FIG. 5C) of the third approximate aerial image, among the auxiliary patterns shown in FIG. 7B. In other words, the second mask pattern is a mask pattern having the initial mask pattern shown in FIG. 3C as a main pattern, and the auxiliary patterns shown in FIG. 8D. The first mask pattern has only transparent auxiliary patterns, and the second pattern has both transparent auxiliary patterns and light-shielding auxiliary patterns. Note that the first mask pattern and second mask pattern are not intended to correspond to the first approximate aerial image and second approximate aerial image, respectively.

Figure 9A:
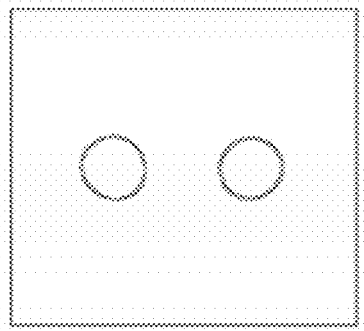
FIGS. 9A to 9D are views for explaining mask data generation in the first embodiment.
Figure 9B:
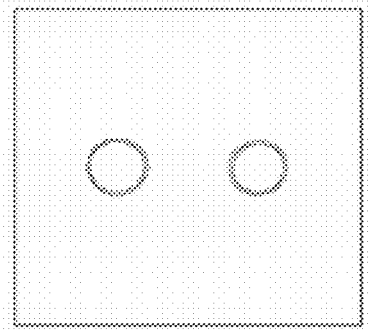
Figure 9C:
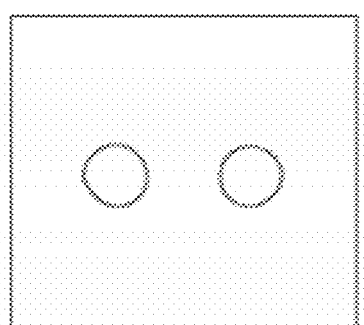
Figure 9D:
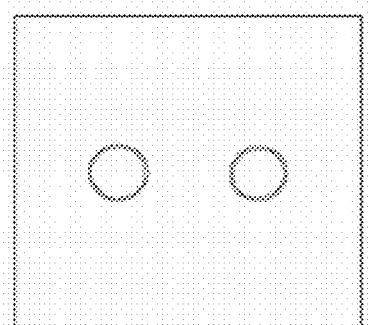

The imaging performances of the first mask pattern and second mask pattern will be described. FIG. 9A is a graph showing a two-dimensional image of the first mask pattern at a best focus position, and FIG. 9B is a view showing a two-dimensional image of the first mask pattern at a position defocused by 0.12 μm from the best focus position. Also, FIG. 9C is a view showing a two-dimensional image of the second mask pattern at a best focus position, and FIG. 9D is a view showing a two-dimensional image of the second mask pattern at a position defocused by 0.12 μm from the best focus position. Note that a slice level at which the horizontal dimension of each hole is 90 nm and that at which this dimension is 90 nm±5% are used. As can be seen from FIGS. 9A to 9D, the auxiliary patterns are not resolved, so the two-dimensional images have small distortion.

The mechanism in which the imaging performances of the first mask pattern and second mask pattern are improved by arranging auxiliary patterns will be described. The imaging performance is evaluated based on the hole diameter (CD) and the NILS. In evaluation based on the CD, a change in dimension in the horizontal and vertical directions in response to a fluctuation in amount of defocus is evaluated. The NILS is obtained by multiplying the gradient of the light intensity at a designated position in the two-dimensional image by the value of the hole dimension. The gradient of the light intensity at a designated position in the two-dimensional image is sometimes called a log slope. The CD and the NILS are calculated based on a mask pattern (its data) having a main pattern at a plurality of amounts of defocus. Note that indices for evaluating the imaging performance are not limited to the CD and the NILS.

FIG. 10A is a graph showing evaluation of the first mask pattern and second mask pattern based on their CDs, and evaluation of a mask pattern having only a main pattern (that is, without auxiliary patterns) based on its CD according to a Comparative Example. As can be seen from FIG. 10A, the first mask pattern and second mask pattern suffer changes in hole dimension in response to a fluctuation in amount of defocus, which are smaller than the mask pattern having only a main pattern, so they have larger depths of focus and better imaging performances than the latter mask pattern. Also, FIG. 10B is a graph showing evaluation of the first mask pattern and second mask pattern based on their NILSs, and evaluation of the mask pattern having only a main pattern (that is, without auxiliary patterns) based on its NILS according to a Comparative Example. As can be seen from FIG. 10B, the first mask pattern and second mask pattern suffer changes in NILS in response to a fluctuation in amount of defocus, which are smaller than the mask pattern having only a main pattern, so they have better imaging performances than the latter mask pattern. Also, the second mask pattern has an NILS higher than the first mask pattern.

A third mask pattern obtained by deforming the main pattern in the first mask pattern will be described. In this case, the main pattern is deformed using the real part of the first approximate aerial image. The approximate aerial image value at the boundary of the target pattern in the real part of the first approximate aerial image is determined as a threshold, and a portion having an approximate aerial image value smaller than or equal to or larger than the threshold is determined as a main pattern. Note that if the approximate aerial image value is larger at the position of the target pattern in the real part of the first approximate aerial image (or the second approximate aerial image) than in the background, a portion having an approximate aerial image value equal to or larger than the threshold is determined as a main pattern. On the other hand, if the approximate aerial image value is smaller at the position of the target pattern in the real part of the first approximate aerial image than in the background, a portion having an approximate aerial image value smaller than the threshold is determined as a main pattern. The approximate aerial image value at the boundary of the target pattern means that for the vertical or horizontal diameter of the target pattern, which is defined by a chord that passes through its center. A contour line which defines this approximate aerial image value is determined as the boundary line of the main pattern on the original in consideration of the magnification of the projection optical system. In other words, a cross-section of the approximate aerial image for the vertical or horizontal diameter of the target pattern, which is defined by a chord that passes through its center, is determined as a main pattern.

Figure 11A:
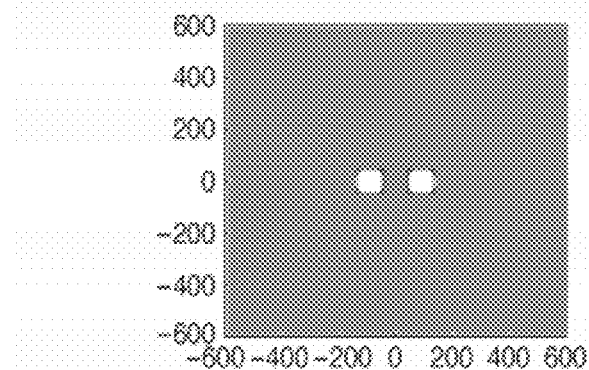
FIGS. 11A to 11D are views for explaining mask data generation in the first embodiment.
Figure 11B:
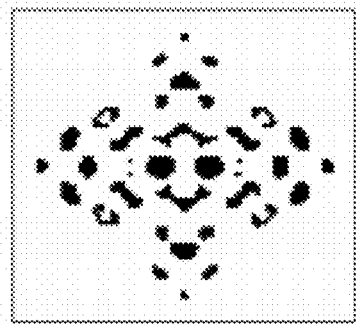

In the first embodiment, an approximate aerial image value at which the vertical dimension of the first approximate aerial image (real part) coincides with the dimension of the target pattern is determined as a threshold, as shown in FIG. 11A. Also, because the approximate aerial image value is smaller at the position of the target pattern in the first approximate aerial image (real part) than in the background, a portion having an approximate aerial image value smaller than the threshold is determined as a main pattern. Thus, the main pattern is deformed to be horizontally elongated. Note that grids representing the shape of the deformed main pattern are increased to form a set of rectangular grids having a size equal to or larger than a predetermined value as well, as described above. FIG. 11B shows a third mask pattern having the thus deformed main pattern and the auxiliary patterns shown in FIG. 8B. Note that both the main pattern and the auxiliary patterns are transparent patterns.

Figure 11C:
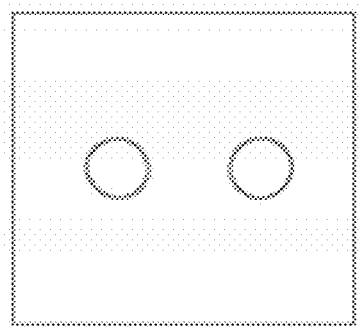
Figure 11D:
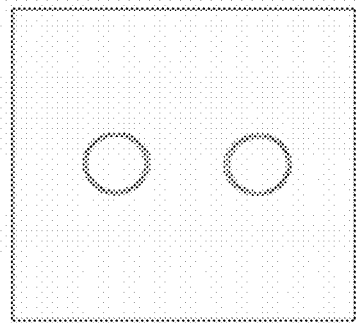

The imaging performance of the third mask pattern will be described. FIG. 11C is a view showing a two-dimensional image of the third mask pattern at a best focus position, and FIG. 11D is a view showing a two-dimensional image of the third mask pattern at a position defocused by 0.12 µm from the best focus position. Note that a slice level at which the horizontal dimension of each hole is 90 nm and that at which this dimension is 90 nm±5% are used. As can be seen from FIGS. 11C and 11D, the auxiliary patterns are not resolved, so the two-dimensional images have small distortion.

FIG. 12A is a graph showing evaluation of the third mask pattern based on its CD, and evaluation of the first mask pattern based on its CD according to a Comparative Example. As can be seen from FIG. 12A, the third mask pattern has vertically elongated elliptical distortion smaller than the first mask pattern at the best focus position (a position having zero defocus). Also, the third mask pattern has a relatively small change in CD in response to a fluctuation in amount of defocus, so it has a better imaging performance. Also, FIG. 12B is a graph showing evaluation of the third mask pattern based on its NILS, and evaluation of the first mask pattern based on NILS according to a Comparative Example. Referring to FIG. 12B, the third mask pattern has a value at the best focus position, which is smaller than the first mask pattern, but has nearly equal values in the vertical and horizontal directions. Also, the third mask pattern suffers a relatively small change in NILS in response to a fluctuation in amount of defocus, so it has a value larger than the first mask pattern at, for example, a position defocused by 0.12 µm from the best focus position. In this manner, the third mask pattern has a depth of focus larger than the first mask pattern.

Second Embodiment

In the second embodiment, a positive resist is assumed as a resist coated on a substrate, and a pattern is assumed to be formed in a portion having a light intensity equal to or higher than a predetermined value. An immersion exposure apparatus which uses a projection optical system having an NA of 1.35, exposure light having a wavelength λ of 193 nm, and water having a refractive index of 1.44 as an immersion liquid is assumed as an exposure apparatus used. The projection optical system is assumed to have no aberration, and light (exposure light) which illuminates a mask is assumed to be non-polarized. Also, a halftone mask (halftone phase shift mask) is assumed as a mask used, the pattern and the background are assumed to be π (180°) out of phase with each other, the pattern is assumed to have a transmittance of 100%, and the background is assumed to have a transmittance of 6%.

Figure 13A:
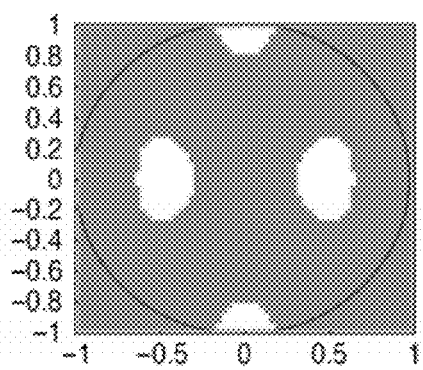
FIGS. 13A and 13B are views for explaining mask data generation in the second embodiment.
Figure 13B:
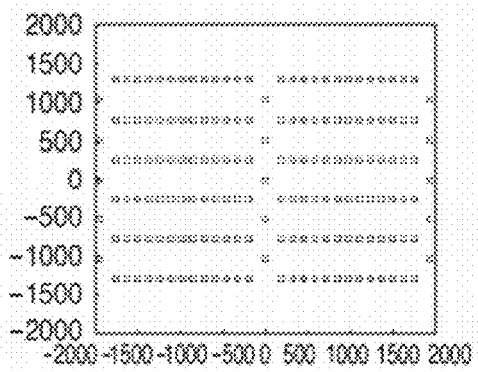

A pattern in which a plurality of 65-nm diameter holes are arranged, as shown in FIG. 13B, is assumed as a target pattern. Also, quadrupole illumination (white portions transmit light), as shown in FIG. 13A, is assumed to be used for an effective light source.

The amount of defocus of a reference image plane in calculating a first approximate aerial image is assumed to be zero, and that of a plane defocused from the reference image plane in calculating a second approximate aerial image is assumed to be 100 nm.

Figure 14A:
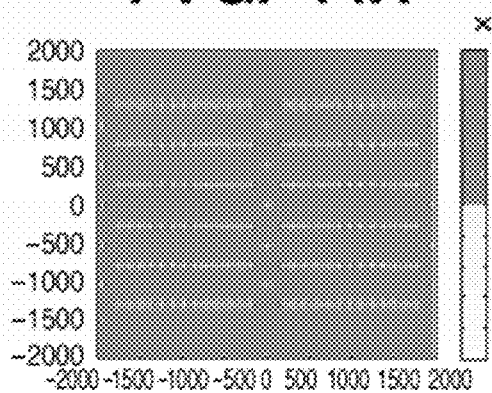
FIGS. 14A and 14B are views for explaining mask data generation in the second embodiment.

When a first approximate aerial image distribution formed on the reference image plane upon placing an initial mask pattern having a shape similar to that of the target pattern shown in FIG. 13B on the object plane is calculated, a distribution as shown in FIG. 14A is obtained. FIG. 14A is a view showing the real part of the first approximate aerial image, and shows by superposition the initial mask pattern. As can be seen from FIG. 14A, no position having the same sign for the approximate aerial image value as that at the position of the target pattern is present in a region distant from the position of the target pattern in the real part of the first approximate aerial image.

Figure 14B:
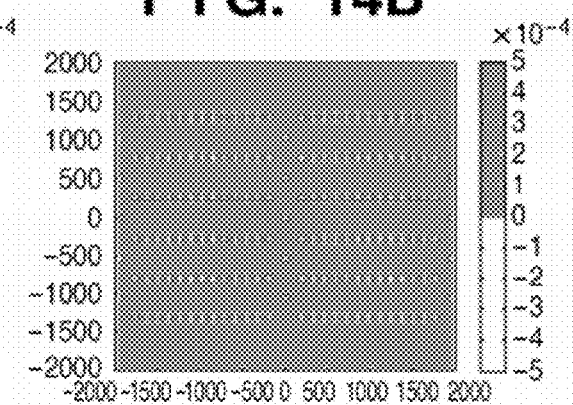

When a second approximate aerial image distribution formed on the plane, which is defocused from the reference image plane, upon placing the initial mask pattern having a shape similar to that of the target pattern shown in FIG. 13B on the object plane is calculated, a distribution as shown in FIG. 14B is obtained. FIG. 14B is a view showing the real part of the second approximate aerial image, and shows by superposition the initial mask pattern. As can be seen from FIG. 14B, no position having the same sign for the approximate aerial image value as that at the position of the target pattern is present in a region distant from the position of the target pattern in the real part of the second approximate aerial image.

When a third approximate aerial image is calculated by subtracting the first approximate aerial image from the second approximate aerial image, a third approximate aerial image as shown in FIG. 15A is obtained. FIG. 15A is a view showing the real part of the third approximate aerial image, and shows by superposition the initial mask pattern. As can be seen from FIG. 15A, a position (a position indicated by gray) having the same sign for the approximate aerial image value as that at the position of the target pattern in the first approximate aerial image distribution is present in a region distant from the position of the target pattern in the real part of the second approximate aerial image, so the position at which an auxiliary pattern is to be placed has a candidate.

FIG. 15B shows the result of obtaining the second-order derivative of the real part of the third approximate aerial image distribution shown in FIG. 15A with respect to the position to calculate an approximate aerial image map, and extracting positions having a negative sign (C21 or less) for the approximate aerial image value before second-order differentiation. Referring to FIG. 15B, a position having a positive sign indicates a valley position having a negative sign for the approximate aerial image value before second-order differentiation. FIG. 15C shows the result of removing positions, having an absolute value of C22 or more for the approximate aerial image value in the imaginary part (non-main part) of the third approximate aerial image, among positions having a positive sign for the approximate aerial image value, and extracting positions having an approximate aerial image value of C21 or more. A position having a sign for the approximate aerial image value, which is different from that at the position of the target pattern in the non-main part, and an absolute value equal to or larger than a threshold, may be removed in the imaginary part of the third approximate aerial image. In the second embodiment, a fourth mask pattern including a main pattern and auxiliary patterns, as shown in FIG. 15C, is determined as a mask pattern.

FIG. 16A is a view showing a two-dimensional image of a mask pattern having only a main pattern (that is, without auxiliary patterns), and FIG. 16B is a view showing a two-dimensional image of the fourth mask pattern. Note that a slice level at which the horizontal dimension of an isolated hole positioned at the center is 65 nm and that at which this dimension is 65 nm±5% are used. In case of the mask pattern having only a main pattern, the light intensity value of the isolated hole positioned at the center is relatively small, and is therefore buried in sub-peaks formed upon interference between light from the main pattern and light from the background, as shown in FIG. 16A. On the other hand, in case of the fourth mask pattern, the light intensity value of the isolated hole positioned at the center is relatively large, and is therefore resolved without being buried in sub-peaks, as shown in FIG. 16B. Hence, the fourth mask pattern has high imaging performance.

In this manner, according to this embodiment, even when a halftone mask is used as an original, a position at which an auxiliary pattern is to be placed can be obtained, thus making it possible to generate a mask pattern (its data) that achieves excellent imaging performance.

An exposure apparatus 100 which uses a mask created based on mask data generated by executing the above-mentioned mask data generation program will be described below with reference to FIG. 17.

The exposure apparatus 100 is an immersion exposure apparatus which transfers the pattern of a mask 130 onto a wafer 150 by exposure via a liquid LW supplied between a projection optical system 140 and the wafer 150. Although the exposure apparatus 100 adopts the step-and-scan scheme in this embodiment, it can also adopt the step-and-repeat scheme or another exposure scheme.

Figure 17:
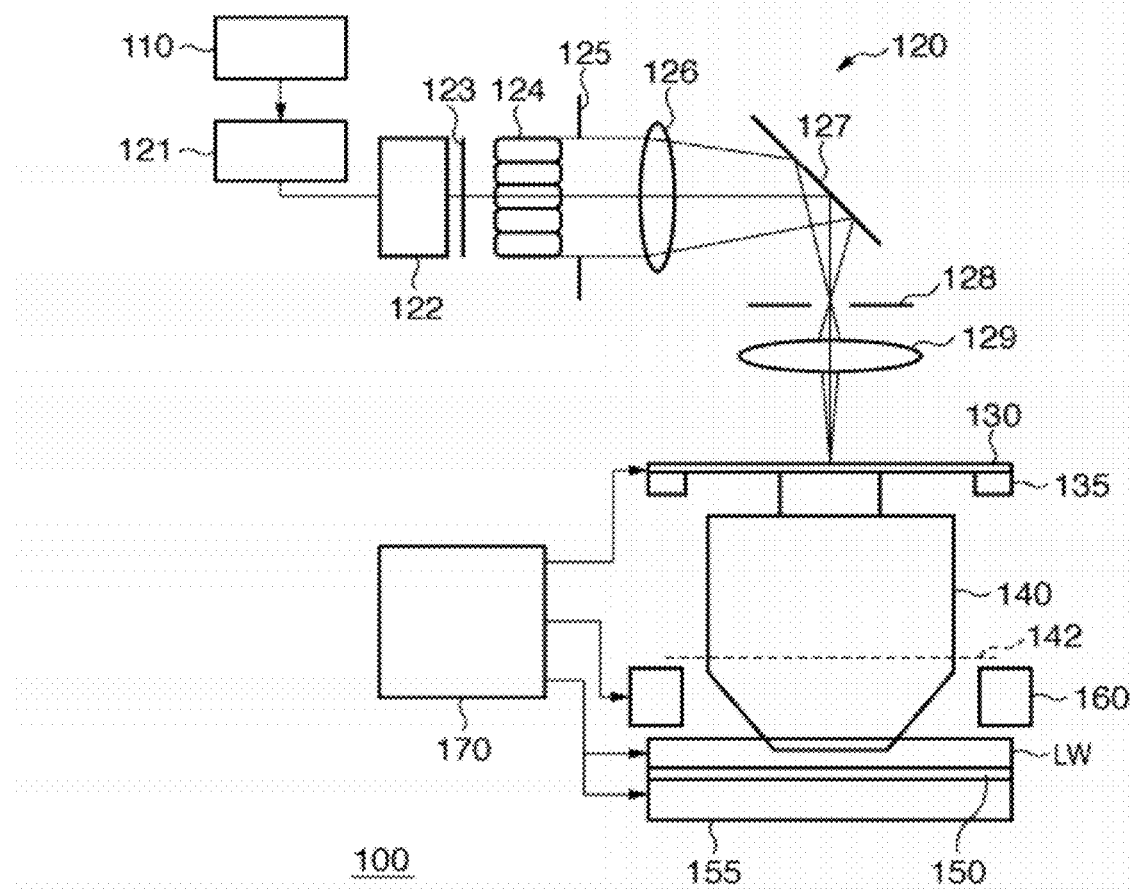
FIG. 17 is a schematic view showing the arrangement of an exposure apparatus.

The exposure apparatus 100 includes a light source 110, an illumination optical system 120, a mask stage 135 which mounts the mask 130, the projection optical system 140, a wafer stage 155 which mounts the wafer 150, a liquid supply/recovery unit 160, and a main control system 170, as shown in FIG. 17. Note that the light source 110 and illumination optical system 120 constitute an illumination device which illuminates the mask 130 on which a circuit pattern to be transferred is formed.

The light source 110 uses an excimer laser such as a KrF excimer laser with a wavelength of about 248 nm or an ArF excimer laser with a wavelength of about 193 nm. However, the types and numbers of light sources 110 are not limited to specific ones, and an $F_2$ laser with a wavelength of about 157 nm, for example, can also be used as the light source 110.

The illumination optical system 120 illuminates the mask 130 with light from the light source 110. The illumination optical system 120 can exploit various illumination modes such as various types of modified illumination as shown in FIGS. 3A and 13A as well as the conventional illumination modes. In this embodiment, the illumination optical system 120 includes a beam shaping optical system 121, condenser optical system 122, polarization control unit 123, optical integrator 124, and aperture stop 125. The illumination optical system 120 also includes a condenser lens 126, deflecting mirror 127, masking blade 128, and imaging lens 129.

The beam shaping optical system 121 uses, for example, a beam expander including a plurality of cylindrical lenses. The beam shaping optical system 121 converts the aspect ratio of the cross-sectional shape of collimated light from the light source 110 to a predetermined value (converts this cross-sectional shape, for example, from a rectangle to a square). In this embodiment, the beam shaping optical system 121 shapes light from the light source 110 into that having a size and an angle of divergence that are required to illuminate the optical integrator 124.

The condenser optical system 122 includes a plurality of optical elements and efficiently guides the light shaped by the beam shaping optical system 121 to the optical integrator 124. The condenser optical system 122 includes, for example, a zoom lens system and adjusts the shape and the distribution of angle of the light incident on the optical integrator 124.

The polarization control unit 123 includes, for example, a polarizing element and is placed at a position nearly conjugate to a pupil plane 142 of the projection optical system 140. The polarization control unit 123 controls the polarization state of a predetermined region in an effective light source formed on the pupil plane 142 of the projection optical system 140.

The optical integrator 124 has a function of uniforming illumination light which illuminates the mask 130, converting the angular distribution of incident light into a positional distribution, and outputting light with this distribution. The optical integrator 124 uses, for example, a fly-eye lens in which its entrance and exit surfaces maintain a Fourier transform relationship. Note that a fly-eye lens is formed by combining a plurality of rod lenses (that is, microlens elements). However, the optical integrator 124 is not limited to a fly-eye lens, and may use, for example, an optical rod, a diffraction grating, or a cylindrical lens array in which each set of lenses are arranged perpendicularly to each other.

The aperture stop 125 is placed at a position which is immediately after the exit surface of the optical integrator 124 and is nearly conjugate to an effective light source formed on the pupil plane 142 of the projection optical system 140. The aperture shape of the aperture stop 125 corresponds to the light intensity distribution (that is, the effective light source shape) of an effective light source formed on the pupil plane 142 of the projection optical system 140. In other words, the aperture stop 125 controls the light intensity distribution of the effective light source. The aperture stop 125 is capable of being switched in accordance with the illumination mode. With or without an aperture stop, a diffraction optical element (CGH) or a prism may be placed on the light source side with respect to the optical integrator 124 to adjust the effective light source shape.

The condenser lens 126 converges light which emerges from a secondary light source formed near the exit surface of the optical integrator 124 and passes through the aperture stop 125, and uniformly illuminates the masking blade 128 via the deflecting mirror 127.

The masking blade 128 is placed at a position nearly conjugate to the mask 130, and includes a plurality of movable light-shielding plates. The masking blade 128 forms an aperture having a nearly rectangular shape corresponding to the effective area of the projection optical system 140. The light having passed through the masking blade 128 is used as illumination light which illuminates the mask 130.

The imaging lens 129 forms an image of the light having passed through the aperture in the masking blade 128 on the mask 130.

The mask 130 is created based on the mask data generated by the information processing apparatus 1 mentioned above, and has a circuit pattern (main pattern) to be transferred and auxiliary patterns. The mask 130 is supported and driven by the mask stage 135. Light diffracted by the mask 130 is projected onto the wafer 150 via the projection optical system 140. The mask 130 and wafer 150 are optically conjugate to each other. Since the exposure apparatus 100 is of the step-and-scan type, it transfers the circuit pattern, to be transferred, of the mask 130 onto the wafer 150 by synchronously scanning them. Note that if the exposure apparatus 100 is of the step-and-repeat type, it performs exposure while the mask 130 and wafer 150 stand still.

The mask stage 135 supports the mask 130 via a mask chuck, and is connected to a driving mechanism (not shown). The driving mechanism (not shown) includes, for example, a linear motor and drives the mask stage 135 in the X-, Y-, and Z-axis directions and rotation directions about the respective axes. Note that the scanning direction within the plane of the mask 130 or wafer 150 is defined as the Y-axis, a direction perpendicular to this scanning direction is defined as the X-axis, and a direction perpendicular to the plane of the mask 130 or wafer 150 is defined as the Z-axis.

The projection optical system 140 projects the circuit pattern of the mask 130 onto the wafer 150. The projection optical system 140 can be, for example, a dioptric system, a catadioptric system, or a catoptric system. The final lens (final surface) of the projection optical system 140 is coated with a coating used to reduce the adverse effect of the liquid LW supplied from the liquid supply/recovery unit 160 (to protect it against the liquid LW).

The wafer 150 is a substrate onto which the circuit pattern of the mask 130 is projected (transferred). However, the wafer 150 can also be substituted by a glass plate or another substrate. The wafer 150 is coated with a resist.

The wafer stage 155 supports the wafer 150 and moves it in the X-, Y-, and Z-axis directions and rotation directions about the respective axes using a linear motor, like the mask stage 135.

The liquid supply/recovery unit 160 has a function of supplying the liquid LW to the space between the final lens (final surface) of the projection optical system 140 and the wafer 150. The liquid supply/recovery unit 160 also has a function of recovering the liquid LW supplied to the space between the final lens of the projection optical system 140 and the wafer 150. As the liquid LW, a substance which has a high transmittance for exposure light, does not make dirt adhere to the projection optical system 140 (its final lens), and is compatible with the resist process is selected.

The main control system 170 includes a CPU and memory and controls the operation of the exposure apparatus 100. For example, the main control system 170 is electrically connected to the mask stage 135, wafer stage 155, and liquid supply/recovery unit 160 to control synchronous scanning between the mask stage 135 and the wafer stage 155. The main control system 170 also controls switching among supply and recovery of the liquid LW and their stop based on the scanning direction and speed of the wafer stage 155 during exposure.

In exposure, a light beam emitted by the light source 110 illuminates the mask 130 by means of the illumination optical system 120. The light beam which bears the information of the circuit pattern upon passing through the mask 130 forms an image on the wafer 150 via the liquid LW by means of the projection optical system 140. The mask 130 used by the exposure apparatus 100 achieves excellent imaging performance, as described above, and can therefore accurately form a fine pattern. Hence, the exposure apparatus 100 can provide high-quality devices (for example, a semiconductor device, an LCD device, an image sensing device (for example, a CCD), and a thin-film magnetic head) with a high throughput and good economic efficiency. These devices are fabricated through a step of exposing a substrate (for example, a wafer or glass plate) coated with a photoresist (sensitizer) by using the exposure apparatus 100, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2010-156184 filed on Jul. 8, 2010, which is hereby incorporated by reference herein in its entirety.

What is claimed is:

1. A generation method of using a computer to generate data of a pattern of an original used for an exposure apparatus including an illumination optical system which illuminates the original with light from a light source, and a projection optical system which projects the pattern of the original onto a substrate, the method comprising:

a first step of calculating a first approximate aerial image distribution represented by a complex number including a real part and an imaginary part as a distribution used to evaluate a light intensity distribution formed on an image plane of the projection optical system upon placing a pattern, which corresponds to a target pattern to be formed on the substrate, on an object plane of the projection optical system;

a second step of calculating a second approximate aerial image represented by a complex number including a real part and an imaginary part as a distribution used to evaluate a light intensity distribution formed on a plane, which is defocused from the image plane of the projection optical system, upon placing the pattern corresponding to the target pattern on the object plane of the projection optical system;

a third step of calculating a third approximate aerial image distribution by subtracting the first approximate aerial image distribution from the second approximate aerial image distribution;

a fourth step of comparing a maximum value of an absolute value of a real part of the third approximate aerial image distribution and a maximum value of an absolute value of an imaginary part of the third approximate aerial image distribution to determine, of the real part and the imaginary part of the third approximate aerial image distribution, the one having a larger maximum value of the absolute value as a main part, and the other one as a non-main part;

a fifth step of determining a temporary pattern obtained by placing a main pattern at a position on the object plane of the projection optical system corresponding to a position of the target pattern in the main part, and placing temporary auxiliary patterns having a transmittance and a phase equal to a transmittance and a phase of the main pattern at positions on the object plane of the projection optical system corresponding to positions in the main part, having a sign for an approximate aerial image value, which is identical to a sign for an approximate aerial image value at the position of the target pattern in one of the first approximate aerial image distribution or the second approximate aerial image distribution; and a sixth step of determining, as an actual auxiliary pattern, a temporary auxiliary pattern, which is placed at a position on the object plane of the projection optical system corresponding to a position having an absolute value less than a threshold for an approximate aerial image at the position of the target pattern in the non-main part, among the temporary auxiliary patterns, setting at least one of the transmittance or the phase of a temporary auxiliary pattern, which is placed at a position on the object plane of the projection optical system corresponding to a position having an absolute value of not less than the threshold for the approximate aerial image at the position of the target pattern in the non-main part, among the temporary auxiliary patterns, to be different from the transmittance and the phase of the main pattern to determine the temporary auxiliary pattern as an actual auxiliary pattern, and generating data of a pattern including the actual auxiliary patterns and the main pattern as the data of the pattern of the original.

2. The method according to claim 1, wherein in the sixth step, the transmittance of a temporary auxiliary pattern, which is placed at a position on the object plane of the projection optical system corresponding to a position having a sign for an approximate aerial image value, which is different from the sign for the approximate aerial image at the position of the target pattern in the non-main part, and an absolute value of not less than the threshold, among the temporary auxiliary patterns is set lower than the transmittance of the main pattern.

3. The method according to claim 2, wherein in the sixth step, the transmittance of a temporary auxiliary pattern, which is placed at a position on the object plane of the projection optical system corresponding to a position having a sign for an approximate aerial image value, which is different from the sign for the approximate aerial image at the position of the target pattern in the non-main part, and an absolute value of not less than the threshold, among the temporary auxiliary patterns is set to zero.

4. The method according to claim 1, wherein:
in the fourth step, a second-order derivative of the third approximate aerial image distribution with respect to a position is obtained, and
in the fifth step, the temporary pattern is determined based on the result of obtaining the second-order derivative of the third approximate aerial image distribution with respect to the position.

5. The method according to claim 1, wherein in the sixth step, data including the actual auxiliary patterns and the main pattern which is deformed so that a difference between the target pattern and an image calculated from the data of the pattern of the original falls within a tolerance is generated as the data of the pattern of the original.

6. The method according to claim 5, wherein:
a maximum value of an absolute value of the real part of the first approximate aerial image and a maximum value of an absolute value of the imaginary part of the first approximate aerial image distribution are compared to determine, of the real part and the imaginary part of the first approximate aerial image distribution, the one having a larger maximum value of the absolute value as a main part, a maximum value of an absolute value of the real part of the second approximate aerial image and a maximum value of an absolute value of the imaginary part of the second approximate aerial image distribution are compared to determine, of the real part and the imaginary part of the second approximate aerial image distribution, the one having a larger maximum value of the absolute value as a main part, and a contour line which defines an absolute value of an approximate aerial image for one of a vertical diameter or a horizontal diameter of the target pattern, which are defined at a center position thereof, is determined as a boundary line of the main pattern in one of the main part of the first approximate aerial image distribution or the main part of the second approximate aerial image distribution.

7. An original creation method comprising the steps of:
generating data of a pattern of an original by a generation method; and
creating an original based on the generated data,
wherein the generation method, which uses a computer to generate the data of the pattern of the original used for an exposure apparatus including an illumination optical system which illuminates the original with light from a light source, and a projection optical system which projects the pattern of the original onto a substrate, comprises:

a first step of calculating a first approximate aerial image distribution represented by a complex number including a real part and an imaginary part as a distribution used to evaluate a light intensity distribution formed on an image plane of the projection optical system upon placing a pattern, which corresponds to a target pattern to be formed on the substrate, on an object plane of the projection optical system;

a second step of calculating a second approximate aerial image represented by a complex number including a real part and an imaginary part as a distribution used to evaluate a light intensity distribution formed on a plane, which is defocused from the image plane of the projection optical system, upon placing the pattern corresponding to the target pattern on the object plane of the projection optical system;

a third step of calculating a third approximate aerial image distribution by subtracting the first approximate aerial image distribution from the second approximate aerial image distribution;

a fourth step of comparing a maximum value of an absolute value of a real part of the third approximate aerial image distribution and a maximum value of an absolute value of an imaginary part of the third approximate aerial image distribution to determine, of the real part and the imaginary part of the third approximate aerial image distribution, the one having a larger maximum value of the absolute value as a main part, and the other one as a non-main part;

a fifth step of determining a temporary pattern obtained by placing a main pattern at a position on the object plane of the projection optical system corresponding to a position of the target pattern in the main part, and placing temporary auxiliary patterns having a transmittance and a phase equal to a transmittance and a phase of the main pattern at positions on the object plane of the projection optical system corresponding to positions in the main part, having a sign for an approximate aerial image value, which is identical to a sign for an approximate aerial image value at the position of the target pattern in one of the first approximate aerial image distribution or the second approximate aerial image distribution; and a sixth step of determining, as an actual auxiliary pattern, a temporary auxiliary pattern, which is placed at a position on the object plane of the projection optical system corresponding to a position having an absolute value less than a threshold for an approximate aerial image at the position of the target pattern in the non-main part, among the temporary auxiliary patterns, setting at least one of the transmittance or the phase of a temporary auxiliary pattern, which is placed at a position on the object plane of the projection optical system corresponding to a position having an absolute value of not less than the threshold for the approximate aerial image at the position of the target pattern in the non-main part, among the temporary auxiliary patterns, to be different from the transmittance and the phase of the main pattern to determine the temporary auxiliary pattern as an actual auxiliary pattern, and generating data of a pattern including the actual auxiliary patterns and the main pattern as the data of the pattern of the original.

8. An exposure method comprising the steps of:

illuminating an original generated by an original creation method; and projecting an image of a pattern of the original onto a substrate via a projection optical system, wherein the original creation method comprises the steps of:

generating data of a pattern of the original by a generation method; and creating the original based on the generated data, and wherein the generation method, which uses a computer to generate the data of the pattern of the original used for an exposure apparatus including an illumination optical system which illuminates the original with light from a light source, and the projection optical system which projects the pattern of the original onto the substrate, comprises:

a first step of calculating a first approximate aerial image distribution represented by a complex number including a real part and an imaginary part as a distribution used to evaluate a light intensity distribution formed on an image plane of the projection optical system upon placing a pattern, which corresponds to a target pattern to be formed on the substrate, on an object plane of the projection optical system;

a second step of calculating a second approximate aerial image represented by a complex number including a real part and an imaginary part as a distribution used to evaluate a light intensity distribution formed on a plane, which is defocused from the image plane of the projection optical system, upon placing the pattern corresponding to the target pattern on the object plane of the projection optical system;

a third step of calculating a third approximate aerial image distribution by subtracting the first approximate aerial image distribution from the second approximate aerial image distribution;

a fourth step of comparing a maximum value of an absolute value of a real part of the third approximate aerial image distribution and a maximum value of an absolute value of an imaginary part of the third approximate aerial image distribution to determine, of the real part and the imaginary part of the third approximate aerial image distribution, the one having a larger maximum value of the absolute value as a main part, and the other one as a non-main part;

a fifth step of determining a temporary pattern obtained by placing a main pattern at a position on the object plane of the projection optical system corresponding to a position of the target pattern in the main part, and placing temporary auxiliary patterns having a transmittance and a phase equal to a transmittance and a phase of the main pattern at positions on the object plane of the projection optical system corresponding to positions in the main part, having a sign for an approximate aerial image value, which is identical to a sign for an approximate aerial image value at the position of the target pattern in one of the first approximate aerial image distribution or the second approximate aerial image distribution; and a sixth step of determining, as an actual auxiliary pattern, a temporary auxiliary pattern, which is placed at a position on the object plane of the projection optical system corresponding to a position having an absolute value less than a threshold for an approximate aerial image at the position of the target pattern in the non-main part, among the temporary auxiliary patterns, setting at least one of the transmittance or the phase of a temporary auxiliary pattern, which is placed at a position on the object plane of the projection optical system corresponding to a position having an absolute value of not less than the threshold for the approximate aerial image at the position of the target pattern in the non-main part, among the temporary auxiliary patterns, to be different from the transmittance and the phase of the main pattern to determine the temporary auxiliary pattern as an actual auxiliary pattern, and generating data of a pattern including the actual auxiliary patterns and the main pattern as the data of the pattern of the original.

9. A device fabrication method comprising steps of:
exposing a substrate using an exposure method; and
performing a development process for the exposed substrate,
wherein the exposure method comprises the steps of:
illuminating an original generated by an original creation method; and
projecting an image of a pattern of the original onto the substrate via a projection optical system,
wherein the original creation method comprises the steps of:
generating data of the pattern of the original by a generation method; and
creating the original based on the generated data,
wherein the generation method, which uses a computer to generate the data of the pattern of the original used for an exposure apparatus including an illumination optical system which illuminates the original with light from a light source, and the projection optical system which projects the pattern of the original onto the substrate, and
wherein the generation method comprises:
a first step of calculating a first approximate aerial image distribution represented by a complex number including a real part and an imaginary part as a distribution used to evaluate a light intensity distribution formed on an image plane of the projection optical system upon placing a pattern, which corresponds to a target pattern to be formed on the substrate, on an object plane of the projection optical system;
a second step of calculating a second approximate aerial image represented by a complex number including a real part and an imaginary part as a distribution used to evaluate a light intensity distribution formed on a plane, which is defocused from the image plane of the projection optical system, upon placing the pattern corresponding to the target pattern on the object plane of the projection optical system;
a third step of calculating a third approximate aerial image distribution by subtracting the first approximate aerial image distribution from the second approximate aerial image distribution;
a fourth step of comparing a maximum value of an absolute value of a real part of the third approximate aerial image distribution and a maximum value of an absolute value of an imaginary part of the third approximate aerial image distribution to determine, of the real part and the imaginary part of the third approximate aerial image distribution, the one having a larger maximum value of the absolute value as a main part, and the other one as a non-main part;
a fifth step of determining a temporary pattern obtained by placing a main pattern at a position on the object plane of the projection optical system corresponding to a position of the target pattern in the main part, and placing temporary auxiliary patterns having a transmittance and a phase equal to a transmittance and a phase of the main pattern at positions on the object plane of the projection optical system corresponding to positions in the main part, having a sign for an approximate aerial image value, which is identical to a sign for an approximate aerial image value at the position of the target pattern in one of the first approximate aerial image distribution or the second approximate aerial image distribution; and
a sixth step of determining, as an actual auxiliary pattern, a temporary auxiliary pattern, which is placed at a position on the object plane of the projection optical system corresponding to a position having an absolute value less than a threshold for an approximate aerial image at the position of the target pattern in the non-main part, among the temporary auxiliary patterns, setting at least one of the transmittance or the phase of a temporary auxiliary pattern, which is placed at a position on the object plane of the projection optical system corresponding to a position having an absolute value of not less than the threshold for the approximate aerial image at the position of the target pattern in the non-main part, among the temporary auxiliary patterns, to be different from the transmittance and the phase of the main pattern to determine the temporary auxiliary pattern as an actual auxiliary pattern, and generating data of a pattern including the actual auxiliary patterns and the main pattern as the data of the pattern of the original.

10. A non-transitory computer-readable storage medium storing a program executable by a computer to execute a generation method of generating data of a pattern of an original used for an exposure apparatus including an illumination optical system which illuminates the original with light from a light source, and a projection optical system which projects the pattern of the original onto a substrate, the generation method comprising:
a first step of calculating a first approximate aerial image distribution represented by a complex number including a real part and an imaginary part as a distribution used to evaluate a light intensity distribution formed on an image plane of the projection optical system upon placing a pattern, which corresponds to a target pattern to be formed on the substrate, on an object plane of the projection optical system;
a second step of calculating a second approximate aerial image represented by a complex number including a real part and an imaginary part as a distribution used to evaluate a light intensity distribution formed on a plane, which is defocused from the image plane of the projection optical system, upon placing the pattern corresponding to the target pattern on the object plane of the projection optical system;
a third step of calculating a third approximate aerial image distribution by subtracting the first approximate aerial image distribution calculated in the first step from the second approximate aerial image distribution calculated in the second step;
a fourth step of comparing a maximum value of an absolute value of a real part of the third approximate aerial image distribution and a maximum value of an absolute value of an imaginary part of the third approximate aerial image distribution to determine, of the real part and the imaginary part of the third approximate aerial image distribution, the one having a larger maximum value of the absolute value as a main part, and the other one as a non-main part;
a fifth step of determining a temporary pattern obtained by placing a main pattern at a position on the object plane of the projection optical system corresponding to a position of the target pattern in the main part, and placing temporary auxiliary patterns having a transmittance and a phase equal to a transmittance and a phase of the main pattern at positions on the object plane of the projection optical system corresponding to positions in the main part, having a sign for an approximate aerial image value, which is identical to a sign for an approximate aerial image value at the position of the target pattern in one of the first approximate aerial image distribution or the second approximate aerial image distribution; and a sixth step of determining, as an actual auxiliary pattern, a temporary auxiliary pattern, which is placed at a position on the object plane of the projection optical system corresponding to a position having an absolute value less than a threshold for an approximate aerial image at the position of the target pattern in the non-main part, among the temporary auxiliary patterns, setting at least one of the transmittance or the phase of a temporary auxiliary pattern, which is placed at a position on the object plane of the projection optical system corresponding to a position having an absolute value of not less than the threshold for the approximate aerial image at the position of the target pattern in the non-main part, among the temporary auxiliary patterns, to be different from the transmittance and the phase of the main pattern to determine the temporary auxiliary pattern as an actual auxiliary pattern, and generating data of a pattern including the actual auxiliary patterns and the main pattern as the data of the pattern of the original.

11. A generation apparatus which generates data of a pattern of an original used for an exposure apparatus including an illumination optical system which illuminates the original with light from a light source, and a projection optical system which projects the pattern of the original onto a substrate, the apparatus comprising:

a processing unit configured to perform processes of generating the data, wherein the processing unit executes:

a first process of calculating a first approximate aerial image distribution represented by a complex number including a real part and an imaginary part as a distribution used to evaluate a light intensity distribution formed on an image plane of the projection optical system upon placing a pattern, which corresponds to a target pattern to be formed on the substrate, on an object plane of the projection optical system, a second process of calculating a second approximate aerial image represented by a complex number including a real part and an imaginary part as a distribution used to evaluate a light intensity distribution formed on a plane, which is defocused from the image plane of the projection optical system, upon placing the pattern corresponding to the target pattern on the object plane of the projection optical system, a third process of calculating a third approximate aerial image distribution by subtracting the first approximate aerial image distribution from the second approximate aerial image distribution, a fourth process of comparing a maximum value of an absolute value of a real part of the third approximate aerial image distribution and a maximum value of an absolute value of an imaginary part of the third approximate aerial image distribution to determine, of the real part and the imaginary part of the third approximate aerial image distribution, the one having a larger maximum value of the absolute value as a main part, and the other one as a non-main part, a fifth process of determining a temporary pattern obtained by placing a main pattern at a position on the object plane of the projection optical system corresponding to a position of the target pattern in the main part, and placing temporary auxiliary patterns having a transmittance and a phase equal to a transmittance and a phase of the main pattern at positions on the object plane of the projection optical system corresponding to positions in the main part, having a sign for an approximate aerial image value, which is identical to a sign for an approximate aerial image value at the position of the target pattern in one of the first approximate aerial image distribution or the second approximate aerial image distribution, and a sixth process of determining, as an actual auxiliary pattern, a temporary auxiliary pattern, which is placed at a position on the object plane of the projection optical system corresponding to a position having an absolute value less than a threshold for an approximate aerial image at the position of the target pattern in the non-main part, among the temporary auxiliary patterns, setting at least one of the transmittance or the phase of a temporary auxiliary pattern, which is placed at a position on the object plane of the projection optical system corresponding to a position having an absolute value of not less than the threshold for the approximate aerial image at the position of the target pattern in the non-main part, among the temporary auxiliary patterns, to be different from the transmittance and the phase of the main pattern to determine the temporary auxiliary pattern as an actual auxiliary pattern, and generating data of a pattern including the actual auxiliary patterns and the main pattern as the data of the pattern of the original.

\* \* \* \* \*